US00RE50325E

(19) United States
(12) Reissued Patent
Nam et al.

(10) Patent Number: US RE50,325 E
(45) Date of Reissued Patent: *Mar. 4, 2025

(54) 3D FLASH MEMORY DEVICE HAVING DUMMY WORD LINES AND DUMMY WORD LINE VOLTAGE GENERATORS

(71) Applicant: SAMSUNG ELECTRONICS CO., LTD., Suwon-si (KR)

(72) Inventors: Sang-Wan Nam, Hwaseong-si (KR); Kitae Park, Seongnam-si (KR)

(73) Assignee: Samsung Electronics Co., Ltd. (KR)

( * ) Notice: This patent is subject to a terminal disclaimer.

(21) Appl. No.: 17/585,800

(22) Filed: Jan. 27, 2022

Related U.S. Patent Documents

Reissue of:
(64) Patent No.: 10,224,105
Issued: Mar. 5, 2019
Appl. No.: 15/978,230
Filed: May 14, 2018

U.S. Applications:
(63) Continuation of application No. 16/670,668, filed on Oct. 31, 2019, now Pat. No. Re. 48,930, which is an
(Continued)

(30) Foreign Application Priority Data

May 10, 2013 (KR) ..... 10-2013-0053212

(51) Int. Cl.
*G11C 16/04* (2006.01)
*G11C 16/08* (2006.01)
(Continued)

(52) U.S. Cl.
CPC ..... *G11C 16/0483* (2013.01); *G11C 16/08* (2013.01); *G11C 16/10* (2013.01); *G11C 16/16* (2013.01); *G11C 16/3427* (2013.01)

(58) Field of Classification Search
CPC ..... G11C 16/0483; G11C 16/08; G11C 16/10; G11C 16/16; G11C 16/3427; G11C 16/20; G11C 16/30
See application file for complete search history.

(56) References Cited

U.S. PATENT DOCUMENTS 8,040,733 B2 10/2011 Jeong et al.
8,045,383 B2 10/2011 Sel
(Continued)

FOREIGN PATENT DOCUMENTS

CN 1519938 A 8/2004
CN 1832046 A 9/2006
(Continued)

OTHER PUBLICATIONS

Chinese Office Action Dated Dec. 11, 2019 Cited in Related Chinese Application No. 201710611341.6.
(Continued)

*Primary Examiner* — B. James Peikari
(74) *Attorney, Agent, or Firm* — Fish & Richardson P.C.

(57) ABSTRACT

A three-dimensional (3D) flash memory includes a first dummy word line disposed between a ground select line and a lowermost main word line, and a second dummy word line of different word line configuration disposed between a string select line and an upper most main word line.

18 Claims, 21 Drawing Sheets

Related U.S. Application Data application for the reissue of Pat. No. 10,224,105, which is a continuation of application No. 15/609,761, filed on May 31, 2017, now Pat. No. 9,984,753, which is a continuation of application No. 15/210,628, filed on Jul. 14, 2016, now Pat. No. 9,697,901, which is a continuation of application No. 14/945,354, filed on Nov. 18, 2015, now abandoned, which is a continuation of application No. 14/162,905, filed on Jan. 24, 2014, now Pat. No. 9,812,206.

(51) Int. Cl.

| | |
|---|---|
| ***G11C 16/10*** | (2006.01) |
| ***G11C 16/16*** | (2006.01) |
| ***G11C 16/34*** | (2006.01) |

(56) References Cited

U.S. PATENT DOCUMENTS

| | | | | |
|---|---|---|---|---|
| 8,208,305 | B2 | 6/2012 | Tanzawa | |
| 8,358,544 | B2 | 1/2013 | Kang | |
| 8,427,871 | B2 | 4/2013 | Han et al. | |
| 8,514,621 | B2 | 8/2013 | Choi et al. | |
| 8,654,586 | B2 | 2/2014 | Kito et al. | |
| 8,699,274 | B2 | 4/2014 | Lee et al. | |
| 8,824,209 | B2 | 9/2014 | Kim et al. | |
| 8,885,420 | B2 | 11/2014 | Oowada et al. | |
| 8,891,315 | B2 | 11/2014 | Lee | |
| 9,036,417 | B2 | 5/2015 | Chen et al. | |
| 9,356,033 | B2 | 5/2016 | Son et al. | |
| 9,812,206 | B2 * | 11/2017 | Nam | G11C 16/16 |
| 9,984,753 | B2 * | 5/2018 | Nam | G11C 16/0483 |
| 2004/0152262 | A1 | 8/2004 | Ichige et al. | |
| 2006/0139997 | A1 | 6/2006 | Park et al. | |
| 2007/0058428 | A1 | 3/2007 | Kang et al. | |
| 2007/0171728 | A1 | 7/2007 | Cho | |
| 2007/0223273 | A1 | 9/2007 | Kang et al. | |
| 2007/0242525 | A1 | 10/2007 | Shen et al. | |
| 2007/0279981 | A1 | 12/2007 | Abe et al. | |
| 2009/0046505 | A1 | 2/2009 | Lee et al. | |
| 2009/0129165 | A1 | 5/2009 | Lee et al. | |
| 2010/0046290 | A1 | 2/2010 | Park et al. | |
| 2010/0097862 | A1 | 4/2010 | Kang et al. | |
| 2010/0128522 | A1 | 5/2010 | Choi et al. | |
| 2010/0232198 | A1 | 9/2010 | Maejima et al. | |
| 2010/0246263 | A1 | 9/2010 | Jeon et al. | |
| 2010/0254191 | A1 | 10/2010 | Son et al. | |
| 2011/0199825 | A1 | 8/2011 | Han et al. | |
| 2011/0205802 | A1 | 8/2011 | Choi et al. | |
| 2011/0211392 | A1 | 9/2011 | Kim et al. | |
| 2011/0216603 | A1 | 9/2011 | Han et al. | |
| 2011/0305088 | A1 | 12/2011 | Huang et al. | |
| 2012/0007167 | A1 * | 1/2012 | Hung | H01L 23/5252 257/E21.645 |
| 2012/0014197 | A1 | 1/2012 | Okuma | |
| 2012/0033501 | A1 | 2/2012 | Park et al. | |
| 2012/0039130 | A1 | 2/2012 | Yoon | |
| 2012/0051137 | A1 | 3/2012 | Hung et al. | |
| 2012/0051143 | A1 | 3/2012 | Yoon | |
| 2012/0081958 | A1 | 4/2012 | Lee et al. | |
| 2012/0081962 | A1 | 4/2012 | Tsai et al. | |
| 2012/0120740 | A1 | 5/2012 | Shim et al. | |
| 2012/0134210 | A1 | 5/2012 | Maeda | |
| 2012/0307561 | A1 | 12/2012 | Joo et al. | |
| 2012/0327714 | A1 | 12/2012 | Lae | |
| 2013/0016561 | A1 | 1/2013 | Nam | |
| 2013/0083599 | A1 | 4/2013 | Nam et al. | |
| 2013/0182502 | A1 | 7/2013 | Cheo et al. | |
| 2013/0235673 | A1 | 9/2013 | Kwak | |
| 2014/0036598 | A1 | 2/2014 | Yang | |

FOREIGN PATENT DOCUMENTS

| | | | |
|---|---|---|---|
| CN | 1929028 | A | 3/2007 |
| CN | 101441893 | A | 5/2009 |
| CN | 101447229 | A | 6/2009 |
| CN | 101751997 | A | 6/2010 |
| CN | 102163456 | A | 8/2011 |
| CN | 102194826 | A | 9/2011 |
| CN | 102376357 | A | 3/2012 |
| CN | 102810332 | A | 12/2012 |
| CN | 102842339 | A | 12/2012 |
| CN | 102881329 | A | 1/2013 |
| KR | 20080085409 | A | 9/2008 |
| KR | 1020100043484 | A | 4/2010 |

OTHER PUBLICATIONS

Daisaburo Takashima et al., "An Embedded DRAM Technology for High-Performance NAND Flash Memories". IEEE Journal of Solid-State Circuits, vol. 47, No. 2, Feb. 2012.

* cited by examiner

3D FLASH MEMORY DEVICE HAVING DUMMY WORD LINES AND DUMMY WORD LINE VOLTAGE GENERATORS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This] *Notice: More than one reissue application has been filed for the reissue of U.S. Pat. No. 10,224,105. These reissue applications are U.S. application Ser. No. 17/585,800 (the present application) and U.S. application Ser. No. 16/670,668. The present application is a Reissue Application of U.S. application Ser. No. 15/978,230, filed on May 14, 2018, which issued as U.S. Pat. No. 10,224,105 on Mar. 5, 2019. U.S. application Ser. No. 17/585,800 is also a continuation application of U.S. application Ser. No. 16/670,668 filed on Oct. 31, 2019, which issued as U.S. Pat. No. RE48,930 on Feb. 15, 2022. Said U.S. application Ser. No. 16/670,668 is a Reissue Application of U.S. application Ser. No. 15/978,230, which* is a Continuation of U.S. application Ser. No. 15/609,761, filed May 31, 2017, now U.S. Pat. No. 9,984,753 issued on May 29, 2018, which is a Continuation of U.S. application Ser. No. 15/210,628, filed Jul. 14, 2016, now U.S. Pat. No. 9,697,901 issued on Jul. 4, 2017, which is a Continuation of U.S. application Ser. No. 14/945,354, filed Nov. 18, 2015, which is a Continuation of U.S. application Ser. No. 14/162,905, filed Jan. 24, 2014, now U.S. Pat. No. 9,812,206 issued on Nov. 7, 2017, which makes a claim of priority under 35 U.S.C. § 119 to Korean Patent Application No. 10-2013-0053212 filed May 10, 2013, the subject matter of which is hereby incorporated by reference.

BACKGROUND

The present inventive concept relates generally to semiconductor memory devices, and more particularly, to a three dimensional (3D) flash memory devices and data storage devices including same.

The continuing integration of flash memory provides the superior performance and cost competitiveness required by contemporary users. There are limits to the level of increased integration that may be achieved by flash memory having two-dimensional (2D) structures. To overcome such limits, 3D flash memory is used with increasing frequency in many applications. However, the use of 3D flash memory is not without its problems including increased program disturbance effects.

SUMMARY

Embodiments of the inventive concept provide a three-dimensional flash memory.

In one embodiment, a three-dimensional (3D) flash memory device is provided having a plurality of cell strings arranged in a direction perpendicular to a substrate. The 3D flash memory comprises; a first cell string connected between a bit line and a common source line and including a program cell, a second cell string connected between the bit line and the common source line and including a program inhibit cell connected to the same word line as the program cell, a first string select line that selects the first cell string and a second string select line that selects the second cell string, a first dummy word line disposed between a ground select line and a lowermost main word line, and a second dummy word line having a different word line configuration than the first dummy word line and disposed between the first and second string select lines and an uppermost main word line.

In another embodiment, a method of operating a three-dimensional (3D) flash memory device is provided, wherein the 3D flash memory includes a plurality of cell strings arranged in a direction perpendicular to a substrate, and the method comprises; during a program operation, using a first dummy word line comprising a first number of word lines disposed between a ground select line and a lowermost main word line, and using a second dummy word line comprising a second number of word lines different from the first number and disposed between a string select line and an uppermost main word line to reduce an electric field difference (Es−Eg) between a first electric field (Es) existing between a boosted channel of a program inhibit cell and a bit line, and a second electric field (Eg) existing between the boosted channel and a common source line.

In yet another embodiment, a data storage device is provided. The data storage device includes a memory controller that controls a three-dimensional (3D) flash memory having a plurality of cell strings arranged in a direction perpendicular to a substrate. The 3D flash memory comprises; a first cell string connected between a bit line and a common source line and including a program cell, a second cell string connected between the bit line and the common source line and including a program inhibit cell connected to the same word line as the program cell, a first string select line that selects the first cell string and a second string select line that selects the second cell string, a first dummy word line disposed between a ground select line and a lowermost main word line, and a second dummy word line having a different word line configuration than the first dummy word line and disposed between the first and second string select lines and an uppermost main word line.

BRIEF DESCRIPTION OF THE DRAWINGS

Certain embodiments of the inventive concept are described hereafter with reference to the accompanying drawings.

DETAILED DESCRIPTION OF EMBODIMENTS

Embodiments of inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

Figure 1:
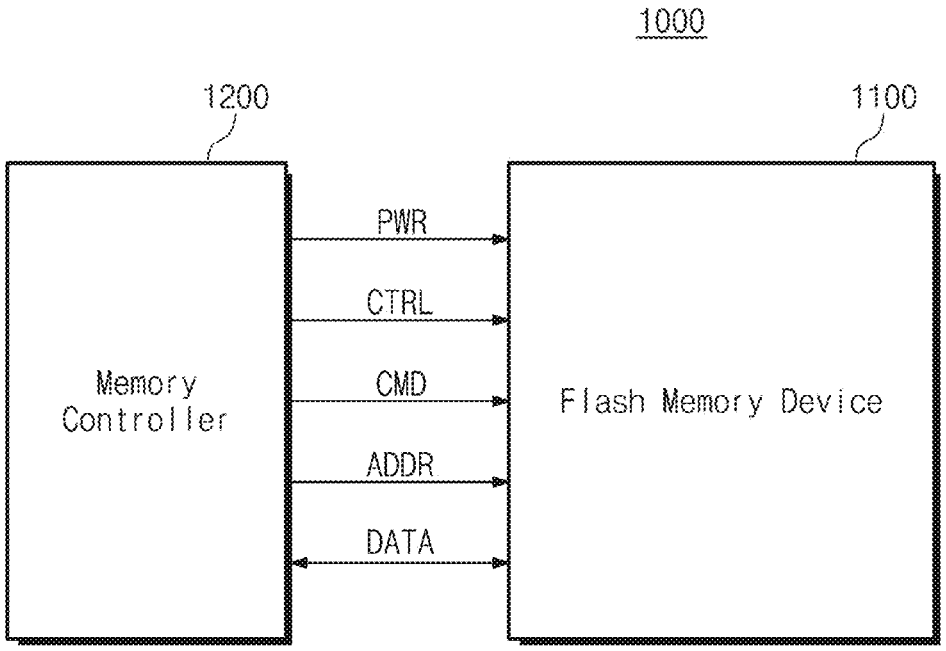
FIG. 1 is a block diagram illustrating a storage device in accordance with some exemplary embodiments of the inventive concept.

FIG. 1 is a general block diagram illustrating a storage device in accordance with certain embodiments of the inventive concept. Referring to FIG. 1, a data storage device 1000 includes a flash memory 1100 and a memory controller 1200. In the description that follows, it is assumed that the data storage device 1000 is implemented from at least one data storage medium (e.g., a memory card, USB memory device, solid-state drive (SSD), etc.) including flash memory.

As will be conventionally appreciated, the flash memory 1100 is able to perform erase, write and/or read operation(s) under the control of the memory controller 1200. To achieve this, the flash memory 1100 will generally receive a command CMD, an address ADDR and/or data DATA via an arrangement of an input/output (I/O) line(s) and/or bus(es). The flash memory 1100 may further receive one or more power supply voltage(s) PWR via power supply line(s), as well as one or more control signal(s) CTRL via designated control line(s). Hereafter, these one or more signals will be referred to in the singular for descriptive clarity, but recognizing that more than one power signal and/or control signal may be present. Those skilled in the art will recognize, for example, that the control signal CTRL indicated in FIG. 1 may include a command latch enable (CLE) signal, an address latch enable (ALE) signal, one or more chip enable (nCE) signal(s), one or more write enable signal(s) (nWE), and/or one or more read enable signal(s) (nRE).

Figure 2:
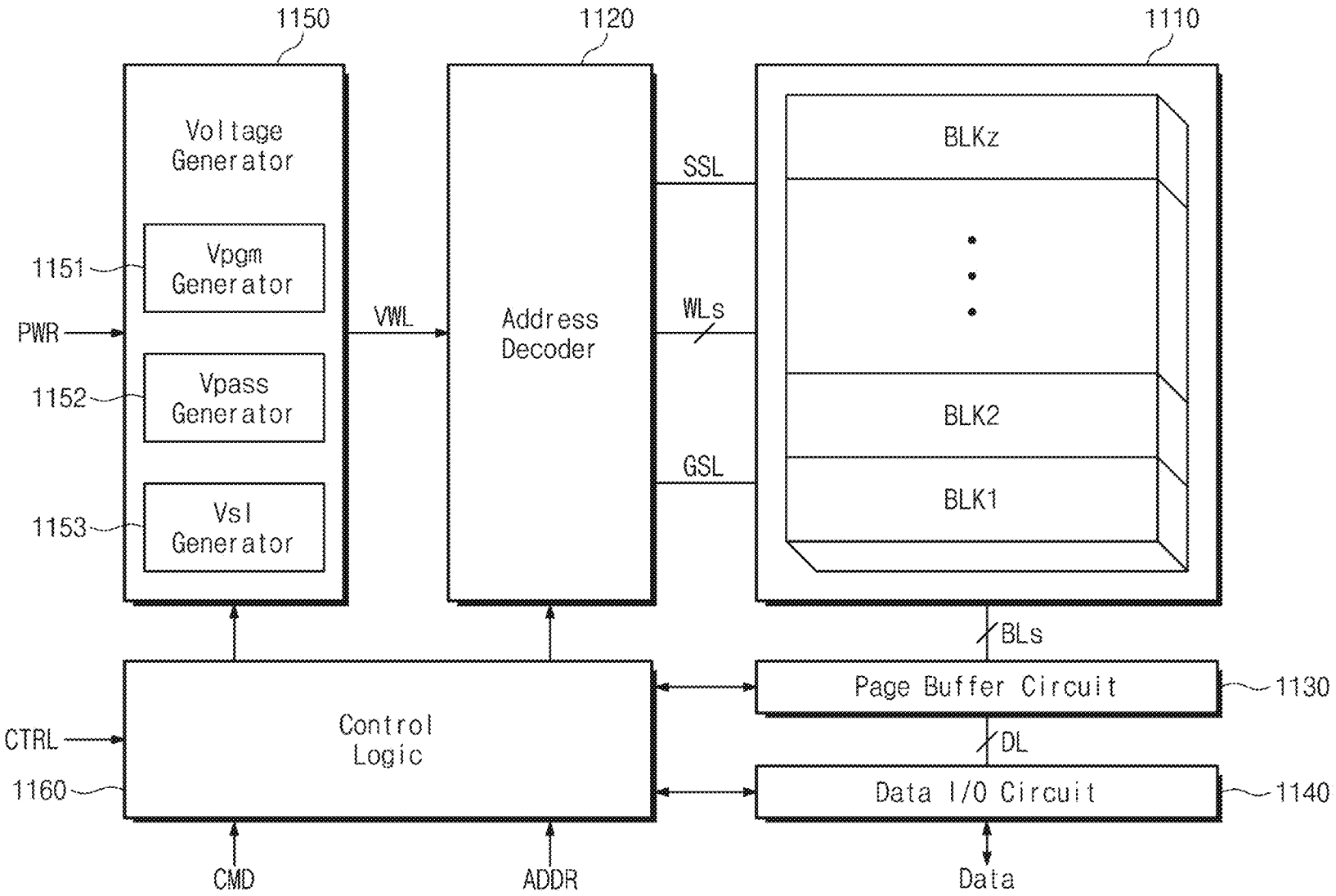
FIG. 2 is a block diagram illustrating a flash memory illustrated in FIG. 1 as an illustration.

FIG. 2 is a block diagram further illustrating in one example the flash memory 1100 of FIG. 1. Referring to FIG. 2, the flash memory 1100 includes a memory cell array 1110, an address decoder 1120, a page buffer circuit 1130, a data input/output circuit 1140, a voltage generator 1150 and control logic 1160.

The memory cell array 1110 includes a plurality of memory blocks BLK1~BLKz. Each memory block may have a three-dimensional (3D, vertical) structure, or a two-dimensional (2D, horizontal) structure. In this context, 2D structures are characterized by memory blocks cells disposed principally in (X-Y) directions parallel to a supporting substrate, whereas 3D structures are characterized by multiple 2D memory blocks being vertically stacked in a (Z) direction orthogonal to the substrate.

Each memory block is commonly divided into a plurality of pages, wherein each respective page includes a plurality of memory cells commonly connected to a word line. Thus, a set of memory cells connected to a common word line may be programmed or read at the same time in a page unit. In contrast, all of the memory cells in a memory block of the flash memory 1100 may be erased in a block unit.

Each memory cell may be used to store one or more data bits. A memory cell configured to store only one bit is referred to as a single-level cell (SLC) or a single bit cell. A memory cell configured to can store two or more bits is referred to as a multi-level cell (MLC) or a multi bit cell.

The address decoder 1120 is connected to the memory cell array 1110 via one or more select line(s) (e.g., string select—SSL, ground line select—GSL) and a plurality of word lines WLs. The address decoder 1120 receives a word line voltage VWL from the voltage generator 1150 and is controlled by the control logic 1160. The address decoder 1120 selects a "selected word line" from among the plurality of word lines during a read and program operations. Thus, a defined program voltage or read voltage is provided to a selected word line to perform a program operation or a read operation.

The page buffer circuit 1130 is connected to the memory cell array 1110 via a plurality of bit lines BLs. In certain embodiments, the page buffer circuit 1130 may include a plurality of page buffers (not shown in FIG. 2), where at least one bit line is connected to each page buffer. The page buffer circuit 1130 may be used to temporarily store program data or data read from a selected page during program and read operations.

The data input/output (I/O) circuit 1140 is internally connected to the page buffer circuit 1130 via a data line and is externally connected to the memory controller 1200 of FIG. 1 via an I/O line. The data I/O circuit 1140 receives program data from the memory controller 1200 during a program operation and provides read data to the memory controller 1200 as the result of a read operation.

The voltage generator 1150 receives a power supply voltage PWR (e.g., Vcc) from the memory controller 1200 and generates a word line voltage VWL needed to read or write data. The word line voltage VWL is provided to the address decoder 1120. The voltage generator 1150 may be used to generate a high voltage (HV) having a level higher than the power supply voltage Vcc. The high voltage (HV) may be used as a program voltage Vpgm or a pass voltage Vpass.

In certain embodiments, the voltage generator 1150 may include a Vpgm generator 1151, a Vpass generator 1152 and a Vsl generator 1153. The Vpgm generator 1151 may be used to generate a program voltage Vpgm being provided to a select word line when a program operation is performed. The program voltage Vpgm may be incrementally increased by programming loop during iteratively performed program operations. The Vpass generator 1152 may be used to generate a pass voltage Vpass being provided to a select or unselect word line during certain program operations. The pass voltage Vpass is usually maintained at a constant level even across a sequence of programming loops. The Vsl generator 1153 may be used to generate a select line voltage being provided to a string select line SSL or a ground select line GSL.

The control logic 1160 may be used to control program, read and erase operations of the flash memory 1100 in response to a received address ADDR and control signal CTRL. During a program operation, the control logic 1160 controls the application of the program voltage Vpgm to a selected word line via the address decoder 1120, and the provision of program data (e.g., page data) via the page buffer circuit 1130 and data I/O circuit 1140.

Figure 3:
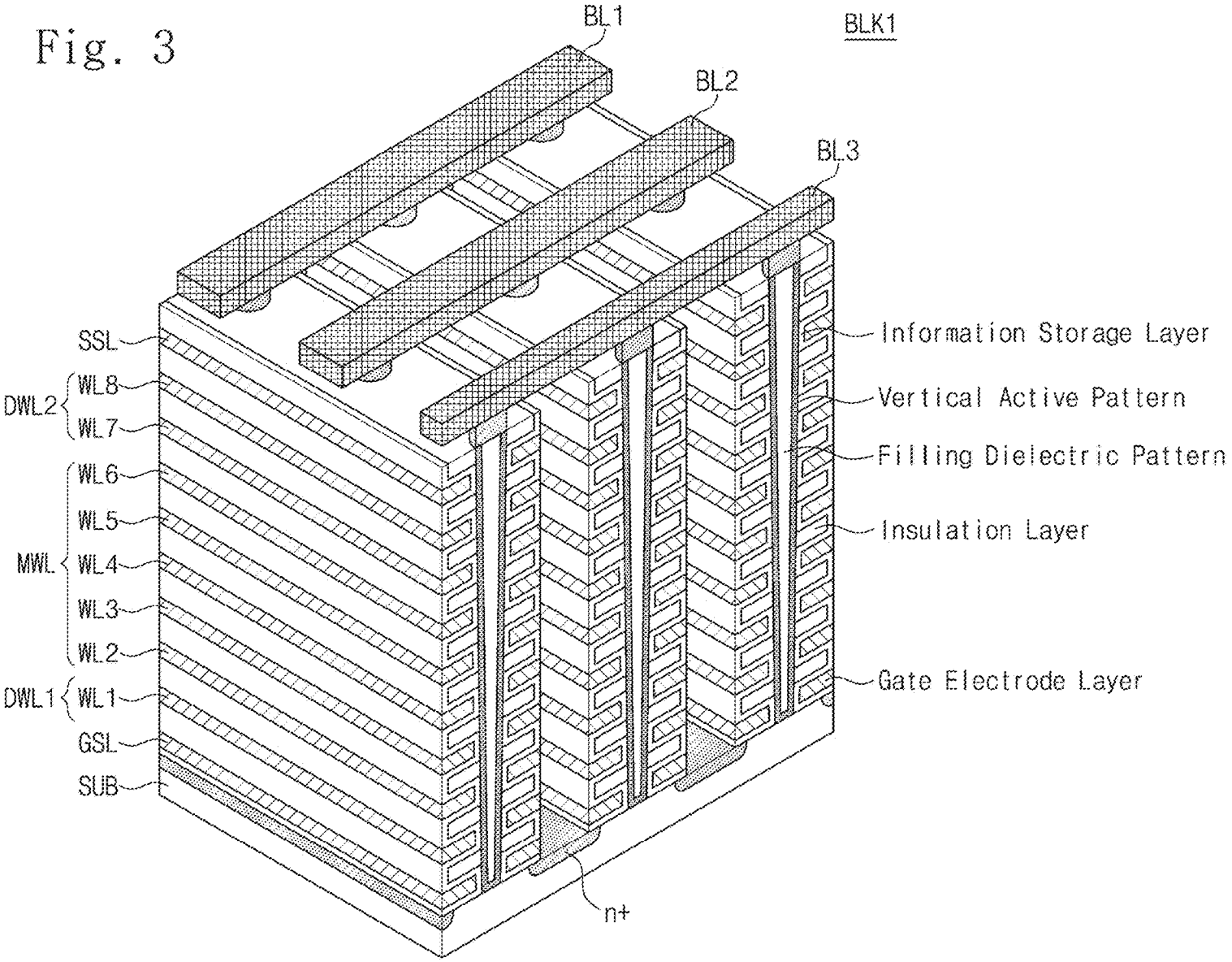
FIG. 3 is a perspective view illustrating a three-dimensional (3D) structure of a memory block BLK1 illustrated in FIG. 2 as an illustration.

FIG. 3 is a perspective view further illustrating in one example a 3D structure for the memory block BLK1 of FIG. 2. Referring to FIG. 3, the memory block BLK1 is formed in a direction perpendicular to a substrate SUB. An n+ doping region is formed in the substrate SUB. A gate electrode layer and an insulating layer are alternately stacked on the substrate SUB.

An information storage layer can be formed between the gate electrode layer and the insulating layer. The information storage layer may be constituted by a tunnel storage layer, a charge storage layer and a blocking insulating layer.

If patterning the gate electrode layer and the insulating layer in a vertical direction, a pillar of a V shape is formed. The pillar passes through the gate electrode layer and the insulating layer to be connected to the substrate SUB. The inside of the pillar is a filling dielectric pattern and may be constituted by an insulating material such as silicon oxide. The outside of the pillar is a vertical active pattern and may be constituted by a channel semiconductor.

The gate electrode layer of the memory block BLK1 can be connected to a ground select line GSL, a plurality of word lines WL1~WLn and a string select line SSL. The pillar of the memory block BLK1 can be connected to a plurality of bit lines BL1~BL3. In FIG. 3, one memory block BLK1 has two select lines (GSL, SSL), eight word lines WL1~WL8 and three bit lines BL1~BL3, but these numbers are merely one example of many different configurations contemplated by the inventive concept.

The collection of word lines WL1~WL8 shown in the memory block BLK1 of FIG. 3 includes at least one main word line MWL (which may be any of word lines WL2~WL6 as shown) and at least one dummy word line DWL. The dummy word line DWL is included as a means of protecting the main word line MWL from noise, and as a means of improving the fabrication uniformity of memory cells connected to the main word line MWL. Thus, in the illustrated example of FIG. 3, a first dummy word line DWL1 is disposed between the ground select line GSL and a "lowest" main word line MWL (WL2) and a second dummy word line DWL2 is disposed between the string select line SSL and a "highest" main word line MWL (WL6). In this context, the terms lowest and highest are arbitrary designation made for respective word lines disposed at vertical locations relative to the substrate SUB.

Thus, in the illustrated embodiment of FIG. 3, the first dummy word line DWL1 is really a lowest overall fabricated word line WL1 and the second dummy word line DWL2 is a combination of the two highest overall fabricated word lines WL7 and WL8 traversing the memory block BLK1. In this regard, dummy word line may be referred to in the singular or in combination, and may have different structures and layout arrangements.

Figure 4:
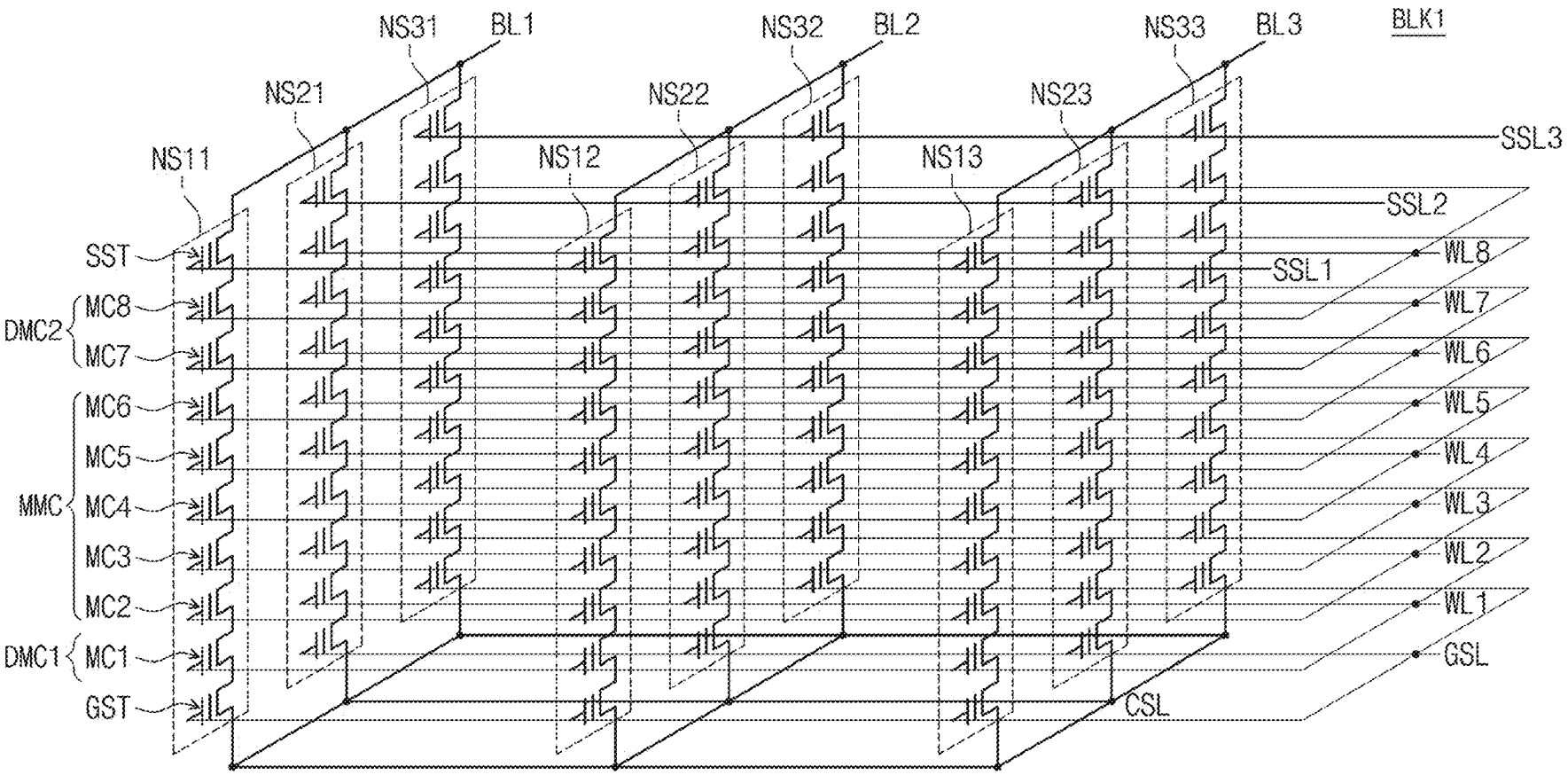
FIG. 4 is an equivalent circuit diagram of the memory block BLK1 illustrated in FIG. 3.

FIG. 4 is an equivalent circuit diagram for the memory block BLK1 of FIG. 3. Referring to FIG. 4, NAND strings NS11~NS33 are connected to one another between a common source line CSL and bit lines BL1~BL3. Each NAND string (e.g., NS11) includes a ground select transistor GST, a plurality of memory cells MC1~MC8 and a string select transistor SST. The NAND string may be called a cell string.

A string select transistor SST is connected to a string select line SSL. The string select line SSL is divided into first through third string select lines SSL1~SSL3. The plurality of memory cells MC1~MC8 is connected to respective word lines WL1~WL8. Word lines having a same height are connected in common. A ground select transistor GST is connected to a ground select line GSL. A string select transistor SST is connected to a bit line BL and a ground select transistor GST is connected to a common source line CSL.

Referring to FIG. 4, each memory cell MC of the memory block BLK1 may be either a "main memory cell MMC" or a "dummy memory cell DMC", where a dummy memory cell DMC is connected to the dummy word line DWL and the main memory cells MMC are connected to the main word lines WL2~WL6 (main word lines MWL as shown in FIG. 3). Thus, as shown in FIG. 4, a first dummy memory cell DMC1 is the first memory cell MC1 connected between the ground select transistor GST and a string of main memory cells MMC, and a second dummy memory cell DMC2 is a combination of the seventh memory cell MC7 and the eighth memory cell MC8 connected between the string select transistor SST and the string of main memory cells MMC.

The three-dimensional flash memory 1100 variously illustrated in FIGS. 2, 3 and 4 is able to reduce the possibility of program disturbances, and thereby increase the overall data reliability of the constituent memory device by providing for each NAND string (NS) of memory cells with both a first dummy memory cell DMC1 and a second dummy memory cell DMC2 having different respective "dummy memory cell configurations". In the illustrated embodiments of FIGS. 3 and 4 these different memory cell configurations include a single dummy memory cell DMC1 arrangement and a multiple dummy memory cell DMC2 arrangement as examples.

Figure 5:
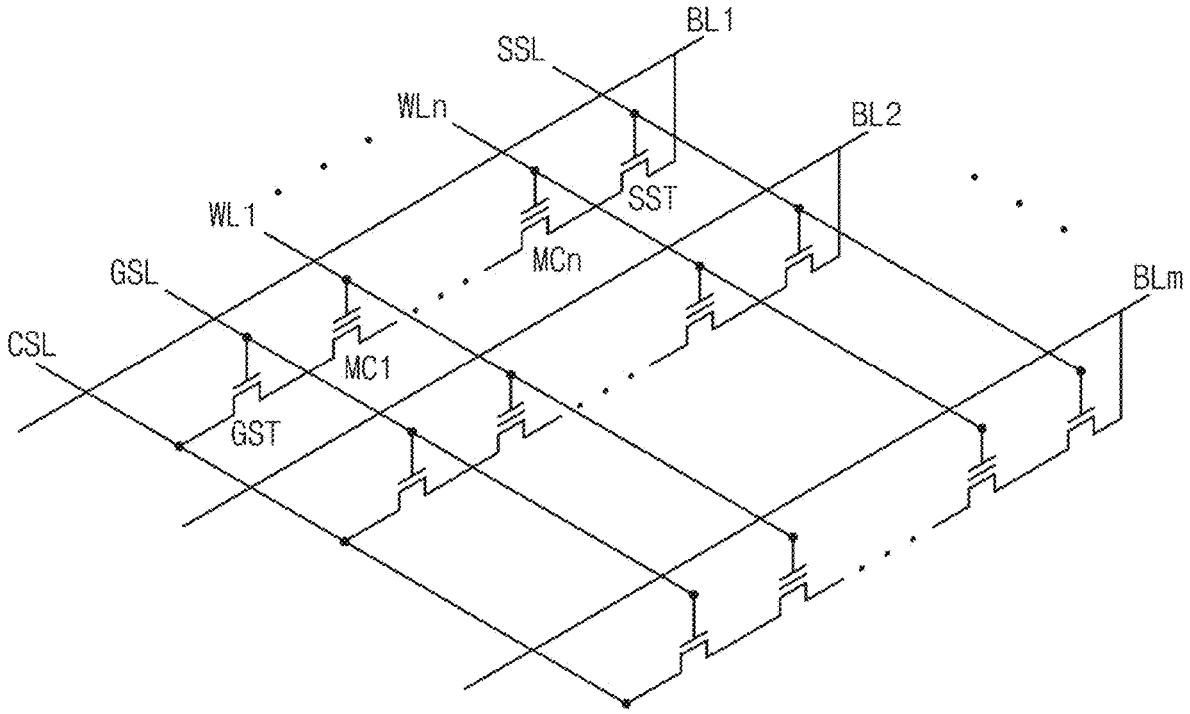
FIG. 5 is a circuit diagram illustrating a memory block of a two-dimensional (2D) flash memory as an illustration.

FIG. 5 is a circuit diagram further illustrating in one example a memory block of a 2D flash memory. The 2D flash memory has a cell string structure in common with the 3D flash memory of FIG. 4. Here, the 2D flash memory is assumed to include 'm' cell strings connected to first through $m^{th}$ bit lines BL1~BLm, respectively.

Referring to FIG. 5, a "cell string" connected to a first bit line BL1 includes a string select transistor SST connected to a string select line SSL, a plurality of memory cells MC1~MCn connected to a plurality of word lines WL1~WLn and a ground select transistor GST connected to a ground select line GSL. The string select transistor SST is connected to the bit line BL1 and the ground select transistor GST is connected to a common source line CSL.

Figure 6:
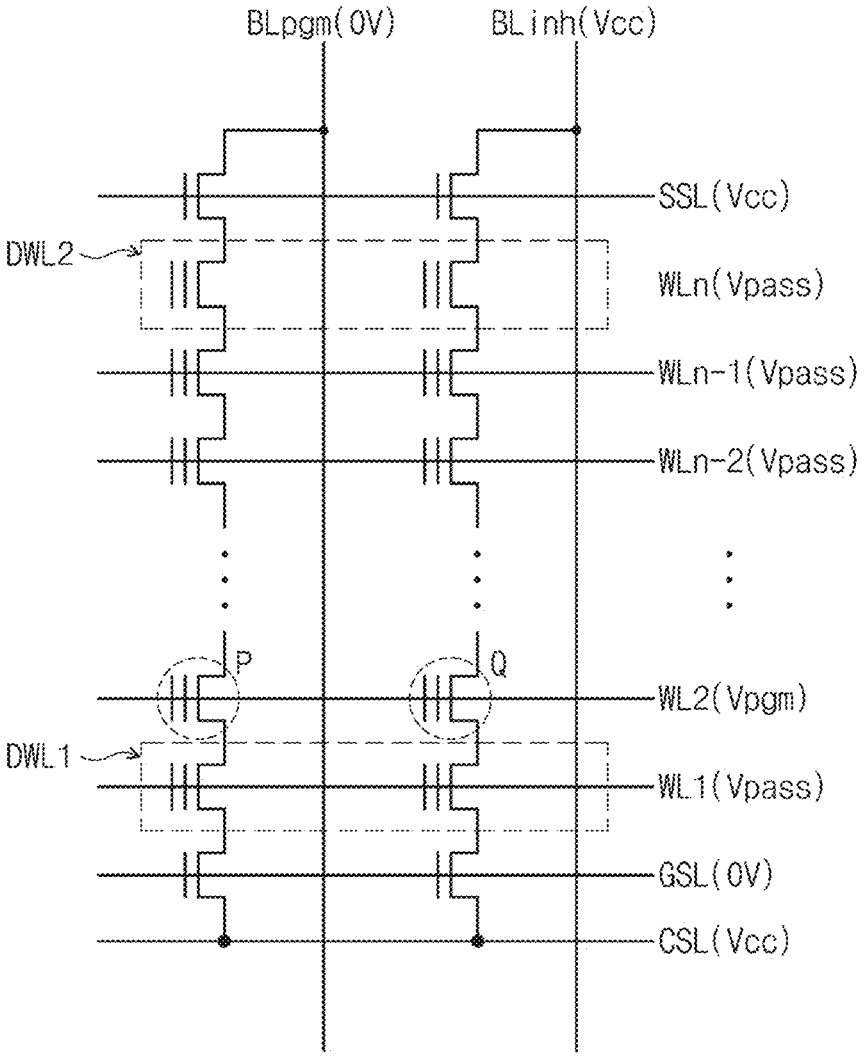
FIG. 6 is a circuit diagram illustrating a program bias condition of the two-dimensional (2D) flash memory illustrated in FIG. 5 as an illustration.

FIG. 6 is a circuit diagram illustrating in one example a program bias condition for the 2D flash memory of FIG. 5. Referring to FIG. 6, during a program operation, 0V is applied to a memory cell being programmed (hereinafter, "program cell"—P) and a power supply voltage Vcc is applied to memory cells bit not being programmed (hereinafter, "program inhibit cell"—Q). A bit line connected to the program cell P is referred to as a "program bit line" BLpgm and a bit line connected to the program inhibit cell Q is referred to as a "program inhibit bit line" BLinh.

During the program operation, the power supply voltage Vcc is applied to the string select line SSL and 0V is applied to the ground select line GSL. A voltage (e.g., Vcc) higher than 0V may be applied to the common source line CSL. A program voltage (e.g., Vpgm=18V) may then be applied to a selected word line (here, assumed to be "WL2") and a pass voltage (e.g., Vpass=8V) is applied to non-selected word lines WLs. The pass voltage (e.g., Vpass=8V) may also be applied to the dummy word lines DWL1 and DWL2 connected to the corresponding dummy memory cells enclosed in the dotted-line boxes. In the embodiment shown in FIG. 6, word line WL1 may be characterized as dummy word line DWL1, word line WLn may be characterized as dummy word line DWL2, and the dotted-line boxes may be considered as corresponding to dummy memory cells.

Under these program bias conditions, the program voltage Vpgm is applied to the gate of the program cell P and a channel voltage of 0V is defined such that a strong electric field is formed between the gate of the program cell P and the channel. At this time, electrons in the channel of the program cell P are injected into a floating gate of the program cell P according to the well understood F-N tunneling effects.

When the program voltage Vpgm is applied to the gate of the program inhibit cell Q, since a channel of the program inhibit cell Q is in a floating state, a channel voltage rises to a boosted level Vb (about 8V) by a capacitive boosted effect formed between the gate and the channel. Since an electric field sufficient to cause F-N tunneling is not formed between the gate of the program inhibit cell Q and the channel of the program inhibit cell Q, the program inhibit cell Q is not programmed.

Figure 7:
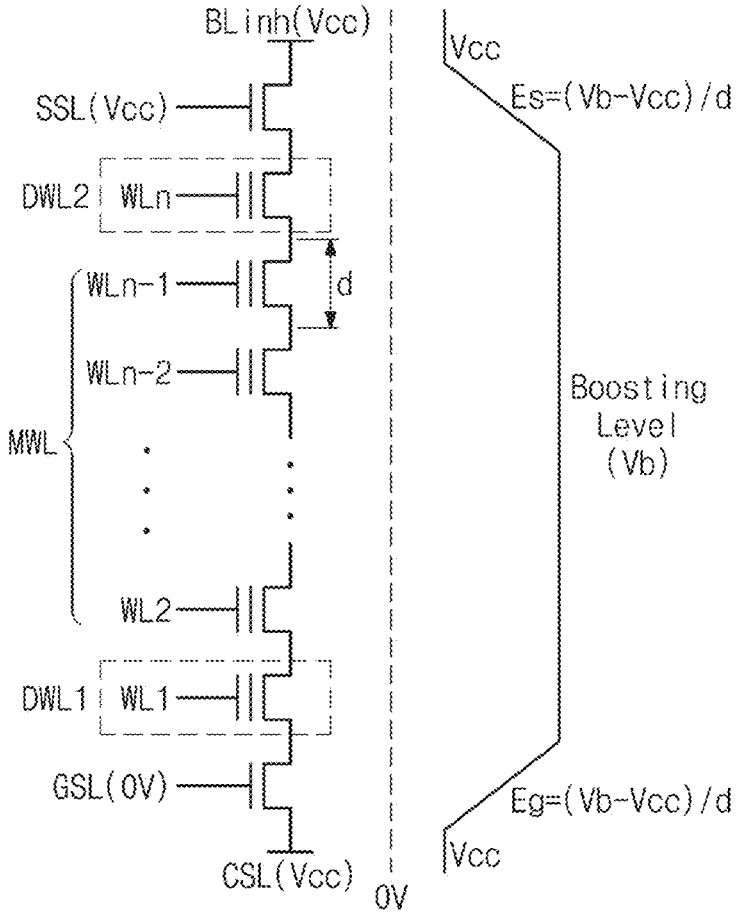
FIG. 7 is a drawing describing a boosted level of a cell string including a program inhibit cell Q in a two-dimensional (2D) flash memory.

FIG. 7 is a conceptual illustration of a memory cell string and further described a boosted level of the cell string including the program inhibit cell Q of the 2D flash memory of FIGS. 5 and 6. Referring to FIG. 7, during the program operation, the program inhibit bit line BLinh and common source line CSL have the power supply voltage Vcc applied and a channel is boosted to level Vb.

Assuming that the length of a memory cell is expressed as "d", and the electric field between the channel and the program inhibit bit line BLinh is expressed "Es", the following relationship emerges:

$$Es = \frac{Vb - Vcc}{d}$$

Expressing an electric field between the channel and the common source line CSL as "Eg" the following relationship emerges:

$$E_g = \frac{Vb - Vcc}{d}$$

Now, assuming that "Es" is equal to "Eg", the 2D flash memory will have a symmetrical voltage level in a direction of the ground select line GSL and string select line SSL on the basis of a channel having the boosted level Vb. Since the 2D flash memory during a program operation has a symmetrical bias voltage level on the basis of the program-inhibit cell, excessive program disturbance effects do not occur in the specific direction SSL or GSL.

Of further note, a dummy word line can also have a symmetric structure in order to protect a word line and improve memory cell pattern uniformity. However, as illustrated in FIG. 7, the respective dummy memory cell configurations associated with the first and second dummy word lines DWL1 and DWL2 of the 2D flash memory may be the same for the ground select line GSL and string select line SSL, respectively. That is, in the illustrated example of FIG. 7, the first dummy word line DWL1 is configured from a first (lowermost) word line WL1 while the second dummy word line DWL2 is configured from an nth (uppermost) word line WLn. Word line WL1 may be characterized as dummy word line DWL1, and word line WLn may be characterized as dummy word line DWL2.

An electric field between a boosted channel of the main word line MWL and the program inhibit bit line BLinh, or between the boosted channel of the main word line MWL and the common source line CSL may be expressed as:

$$Es = E_g = \frac{Vb - Vcc}{(k+1)d}$$

Here, "k" is a number of first or second dummy word line(s) (DWL1, DWL2). Assuming that the number of the first dummy word line DWL1 and the number of the second dummy word line DWL2 is the same (i.e., 1), the foregoing relationship becomes:

$$Es = E_g = \frac{Vb - Vcc}{2d}$$

As described above, in a 2D flash memory, an electric field difference between the two select lines SSL and GSL does not exist on the basis of the boosted channel of the program inhibit cell, and excessive program disturbance effects do not occur in the specific direction SSL or GSL. However, in a 3D flash memory, due to the very different nature of its structure, an electric filed difference between the two select lines SSL and GSL exists on the basis of the boosted channel of the program inhibit cell, and excessive program disturbance effects may occur in the specific direction SSL or GSL.

To reduce the likelihood of program disturbance effects, certain 3D flash memories designed in accordance with embodiments of the inventive concept include at least one first dummy word line DWL1 adjacent to the ground select line GSL and at least one second dummy word line DWL2 adjacent to the string select line SSL, wherein the first dummy word line DWL1 and second dummy word line DWL2 have different dummy memory cell configurations.

Figure 8:
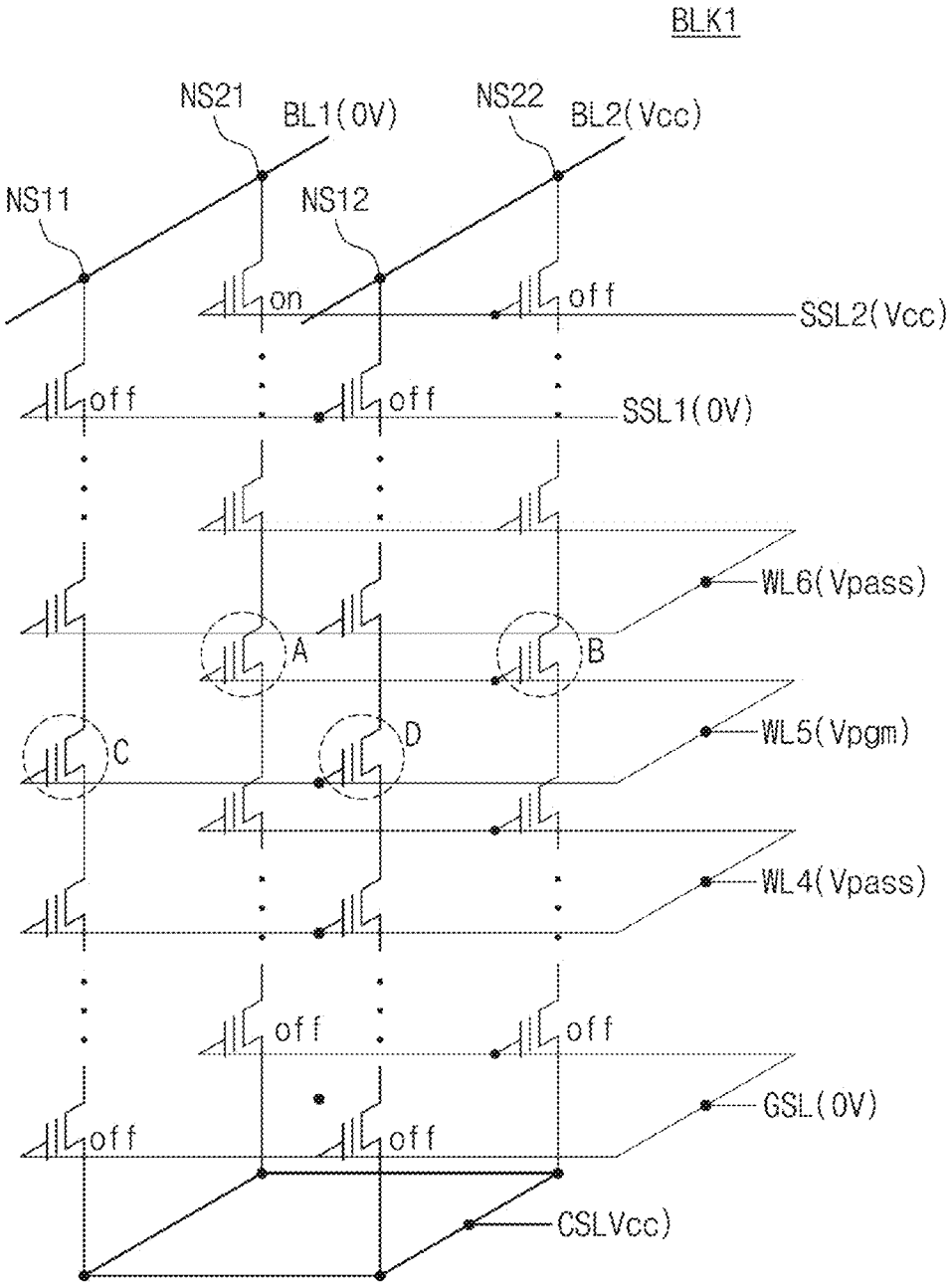
FIG. 8 is a circuit diagram illustrating a program bias condition of the three-dimensional (3D) flash memory illustrated in FIG. 4.

FIG. 8 is a circuit diagram illustrating in one example program bias conditions for the 3D flash memory of FIG. 4.

In FIG. 8, cell strings NS11 and NS21 are connected to a first bit line BL1 and cell strings NS12 and NS22 are connected to a second bit line BL2.

The first bit line BL1 is a program bit line BLpgm to which 0V is applied and the second bit line BL2 is a program inhibit line BLinh to which a power supply voltage Vcc is applied. If it is assumed that the cell string NS21 is selected during a program operation, 0V is applied to a first string select line SSL1 and a power supply voltage Vcc is applied to a second string select line SSL2.

Under these program bias conditions, 18V is applied to the gate of a memory cell "A" having a channel voltage of 0V. Since a strong electric field is formed between the gate of memory cell A and its channel, memory cell A will be programmed. However, since the respective channels of memory cells "B", "C" and "D" are in a floating state, the channel voltage rises to a boosted level Vb (about 8V) and the memory cells B, C and D will not be programmed.

In FIG. 8, the program inhibit cells B and D are connected to the second bit line BL2 having a channel boosted level or approximate to that of the cell string described in the 2D flash memory of FIG. 7. Since the 3D flash memory during a program operation will have a symmetrical voltage level on the basis of a boosted channel of the program inhibit cells B and D, an electric field difference between the boosted channel and the bit line BL2, or between the boosted channel and the common source line CSL almost does not exist.

Hence, the program inhibit cell C connected to the first bit line BL1—unlike the 2D flash memory of FIG. 7—has an asymmetrical voltage level during the illustrated program operation. Thus, during the program operation, 0V is applied to the first bit line BL1 and a power supply voltage Vcc is applied to the common source line CSL. Since the cell string NS11 has an asymmetrical voltage level on the basis of the boosted channel, an electric field difference occurs between the boosted channel and the first bit line BL1, or between the boosted channel and the common source line CSL. Due to this electric field difference, in the cell string NS11, excessive program disturbance effects may occur in the specific direction GSL or SSL.

Figure 9:
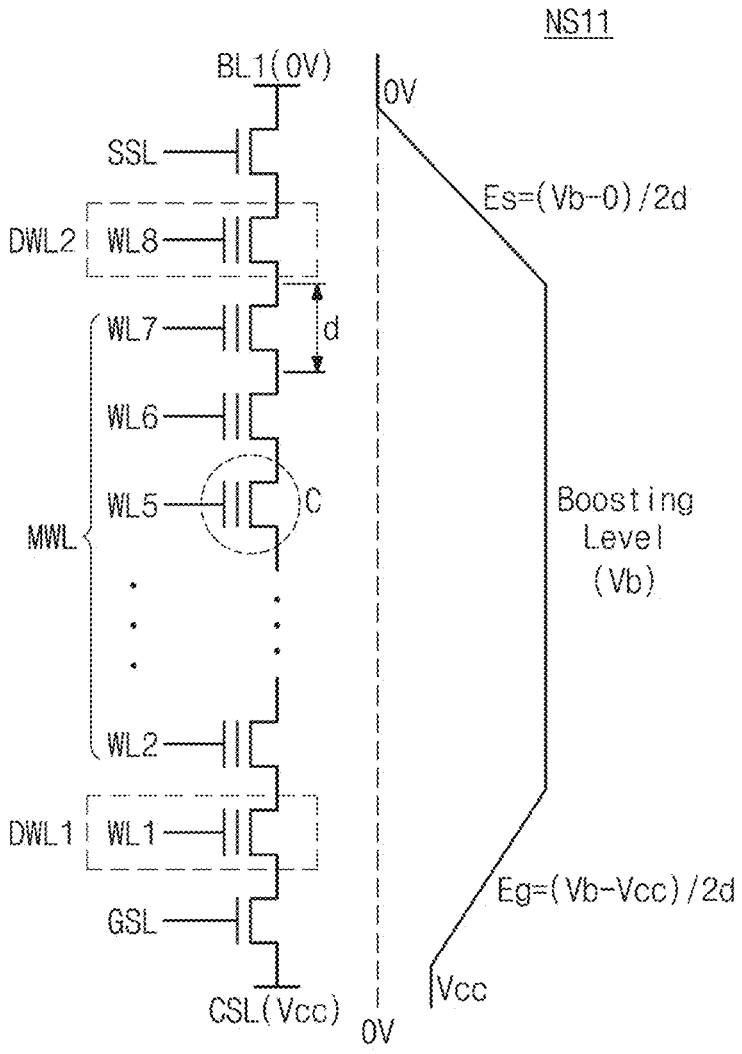
FIGS. 9 and 10 are drawings illustrating a bias condition of a program inhibit cell C connected to a first bit line BL1 of FIG. 8.
Figure 10:
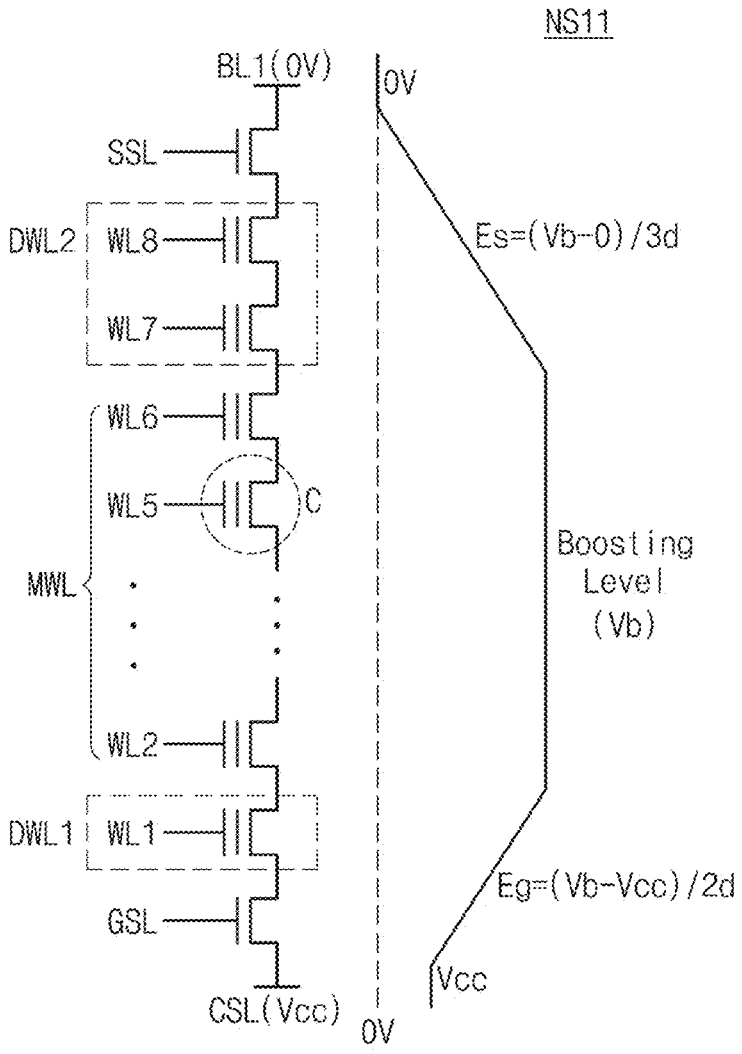

FIGS. 9 and 10 are respective conceptual illustrations further describing the channel boosted level of the cell string NS11 of FIG. 8 connected to the first bit line BL1, and the electric fields Es and Eg in the direction of the two select lines GSL and SSL. FIG. 9 illustrates a case wherein a number of word lines forming the first dummy word line DWL1 is the same as a number of word lines forming the second dummy word line DWL2. That is, FIG. 9 illustrates a case wherein the same dummy memory cell configuration is used to implement both first and second dummy word lines DWL1 and DWL2. In contrast, FIG. 10 illustrates a case wherein a number of word lines used to implement the first dummy word line DWL1 is different from a number of word lines used to implement the second dummy word line DWL2.

Referring to FIG. 9, the first dummy word line DWL1 includes only a first word line WL1, the second dummy word line DWL2 includes only an eighth word line WL8. Word line WL1 may be characterized as dummy word line DWL1, and word line WL8 may be characterized as dummy word line DWL2. Thus, the main word lines MWL include the second through seventh word lines WL2~WL7. The program inhibit cell C is assumed to be a memory cell connected to the fifth word line WL5.

During a program operation, 0V is applied to the first bit line BL1 and a power supply voltage Vcc is applied to the common source line CSL. When a program voltage Vpgm is applied to the selected word line WL5, a channel voltage becomes a boosted level Vb.

As previously described, if the length of a memory cell is "d", and an electric field between the channel of the main word line MWL and the first bit line BL1 is "Es", the following relationship emerges:

$$Es = \frac{Vb - 0}{2d}$$

Further assuming an electric field "Eg" between the channel of the main word line MWL and the common source line CSL, it follows that:

$$E_g = \frac{Vb - Vcc}{2d}$$

Referring to FIG. 9 and the preceding two (2) relationships, an electric field difference between "Es" and "Eg" may be expressed as:

$$Es - E_g = \frac{Vb - 0}{2d} - \frac{Vb - Vcc}{2d} = \frac{Vcc}{2d}$$

The above described electric field difference occurs because unlike the 2D flash memory, there is a case that 0V is applied to the first bit line BL1 connected to the program inhibit cell C. That is, this is because the cell string NS11 including the program inhibit cell C exists in the first bit line BL1. Accordingly, a 3D flash memory has asymmetrical voltage level on the basis of the boosted channel during a program operation, and thereby excessive program disturbance may occur in a specific direction GSL or SSL.

Referring to FIG. 10, it is again assumed that the first dummy word line DWL1 includes only the first word line WL1. However, the second dummy word line DWL2 is now assumed to include the seventh and eighth word lines WL7 and WL8. Word line WL1 may be characterized as dummy word line DWL1, and word lines WL7 and WL8 may be commonly connected and characterized as dummy word line DWL2. These different "dummy word line configurations" inherently result in different dummy memory cell configurations as the first dummy word line connects only a single dummy memory cell per cell string while the second dummy word line connects two dummy memory cells per cell string.

As noted in the working example, the main word lines MWLs include second through sixth word lines WL2~WL6. In this case, an electric field "Es" between a channel of the main word line MWL and the first bit line BL1 may be expressed as:

$$Es = \frac{Vb - 0}{3d}$$

An electric field "Eg" between a channel of the main word line MWL and the common source line CSL may be expressed as:

$$E_g = \frac{Vb - Vcc}{2d}$$

Referring to FIG. 10 and the two preceding relationships, an electric field difference between "Es" and "Eg" may be expressed as:

$$Es - E_g = \frac{Vb - 0}{3d} - \frac{Vb - Vcc}{2d} = \frac{Vcc}{2d} - \frac{Vb}{6d}$$

Upon comparing this result with results above related to FIG. 9, the provision different dummy word line configurations for the first and second dummy word lines DWL1 and DWL2 enables a Vb/6d reduction in the electric filed difference between "Es" and "Eg".

Hence, 3D flash memories in accordance with embodiments of the inventive concept, such as the one illustrated in FIG. 10, can reduce the likelihood of program disturbance effects due to an electric field difference by ensuring that a first dummy word line DWL1 configuration is different from a second dummy word line DWL2 configuration.

Figure 11:
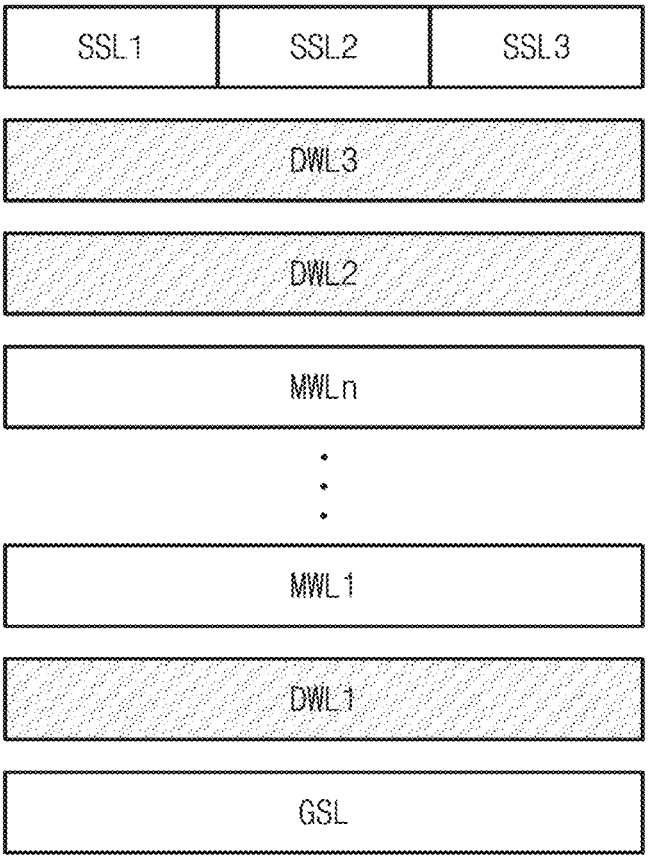
FIGS. 11, 12 and 13 are schematic views illustrating a word line structure of a three-dimensional (3D) flash memory in accordance with some exemplary embodiments of the inventive concept.
Figure 12:
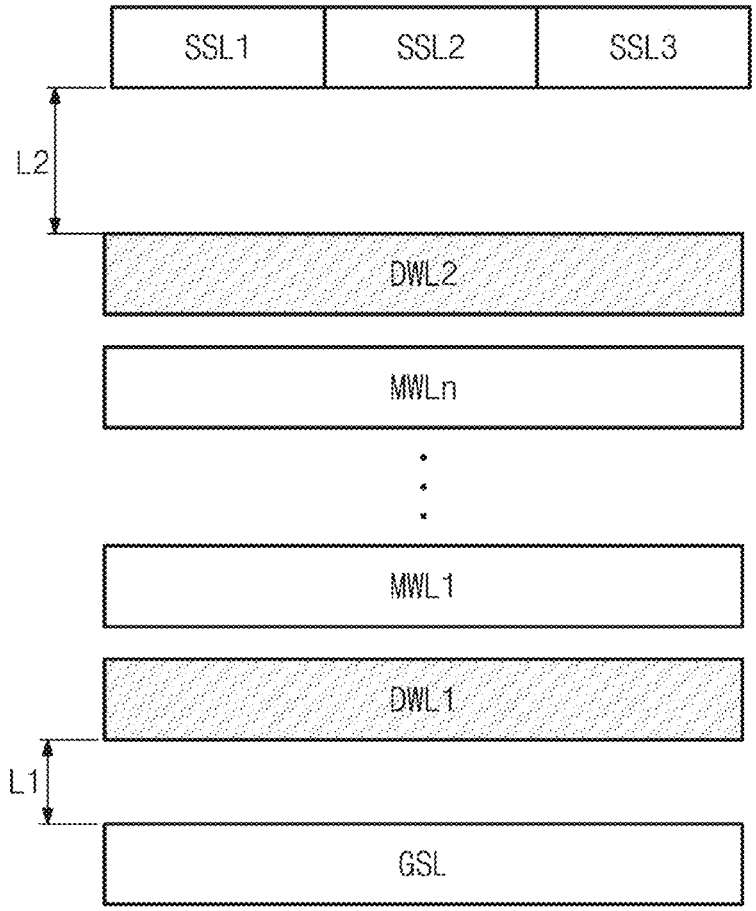
Figure 13:
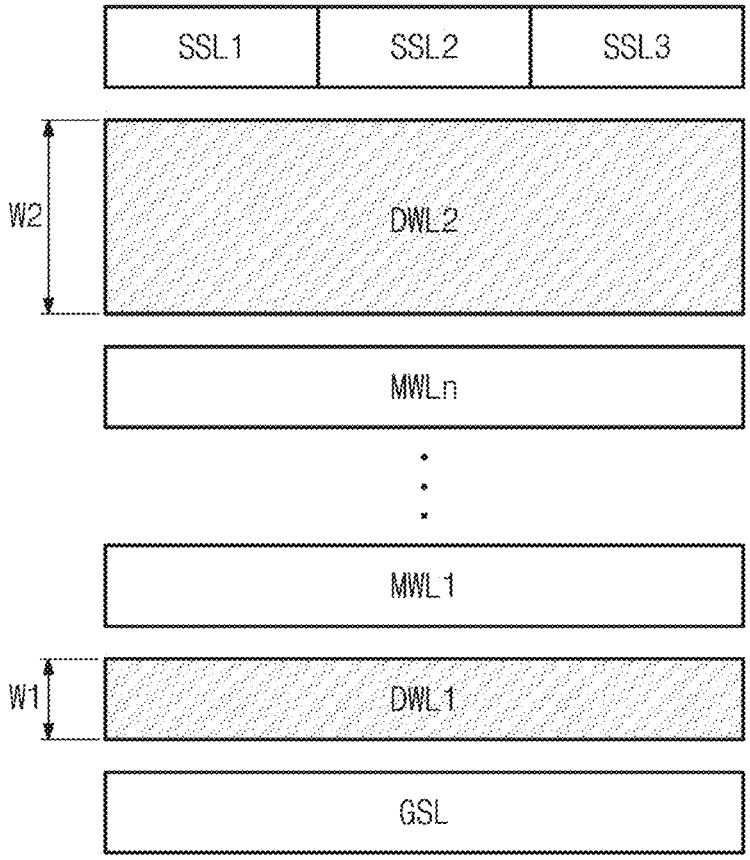

FIGS. 11, 12 and 13 are respective schematic views illustrating possible dummy word line configurations that may be used in 3D flash memory in accordance with embodiments of the inventive concept.

Referring to FIG. 11, a single (first) dummy word line DWL1 is disposed between a ground select line GSL and a first main word line MWL1, while adjacent, twin-dummy word lines DWL2 and DWL3 are disposed between string select lines SSL1~SSL3 and a nth main word line MWLn. In certain embodiments of the inventive concept, an electric field difference may be reduced and program disturbance effects reduced by providing one number of individual dummy word lines at the string select line SSL end (or side) of a memory cell array and a different number of individual dummy word lines at the ground select line GSL end (or side) of the memory cell array. Here, "individual" dummy word lines are distinct from "grouped" or commonly connected dummy word lines in a 3D flash memory.

Referring to FIG. 12, a first separation "length" (L) between the ground select line GSL and a first dummy word line DWL1 is assumed to be "L1" while a second separation length between the string select line SSL and a second dummy word line DWL2 is assumed to be "L2", where L2 is greater than the L1. This exemplary arrangement of dummy word lines to respective selection lines is another way of providing "different dummy word line configurations". Thus, certain 3D flash memory in accordance with embodiments of the inventive concept may reduce an electric field difference by providing different separation lengths between respective dummy word lines and corresponding selection lines (e.g., SSL and GSL).

Referring to FIG. 13, a first fabricated line "width" (W) for a first dummy word line DWL1 is assumed to be "W1", and a second width for a second dummy word line DWL2 is assumed to be "W2", where W2 is greater than W1. Here again, different dummy word line configurations result.

According to the various "different word line configurations" for 3D flash memory illustrated in FIGS. 11, 12 and 13, an electric field difference occurring in a direction of the select lines GSL and SSL can be reduced. The inventive concept can reduce the electric field difference occurring in both directions and program disturbance due to an electric field difference by making a length between the main word line MWL and a bit line BL long.

3D flash memory in accordance with certain embodiments of the inventive concept can reduce an electric field difference by controlling the voltage applied to the common source line CSL. That is, the 3D flash memory can reduce an electric field difference occurring in both directions by applying a voltage lower than the power supply voltage Vcc to the common source line CSL.

Figure 14:
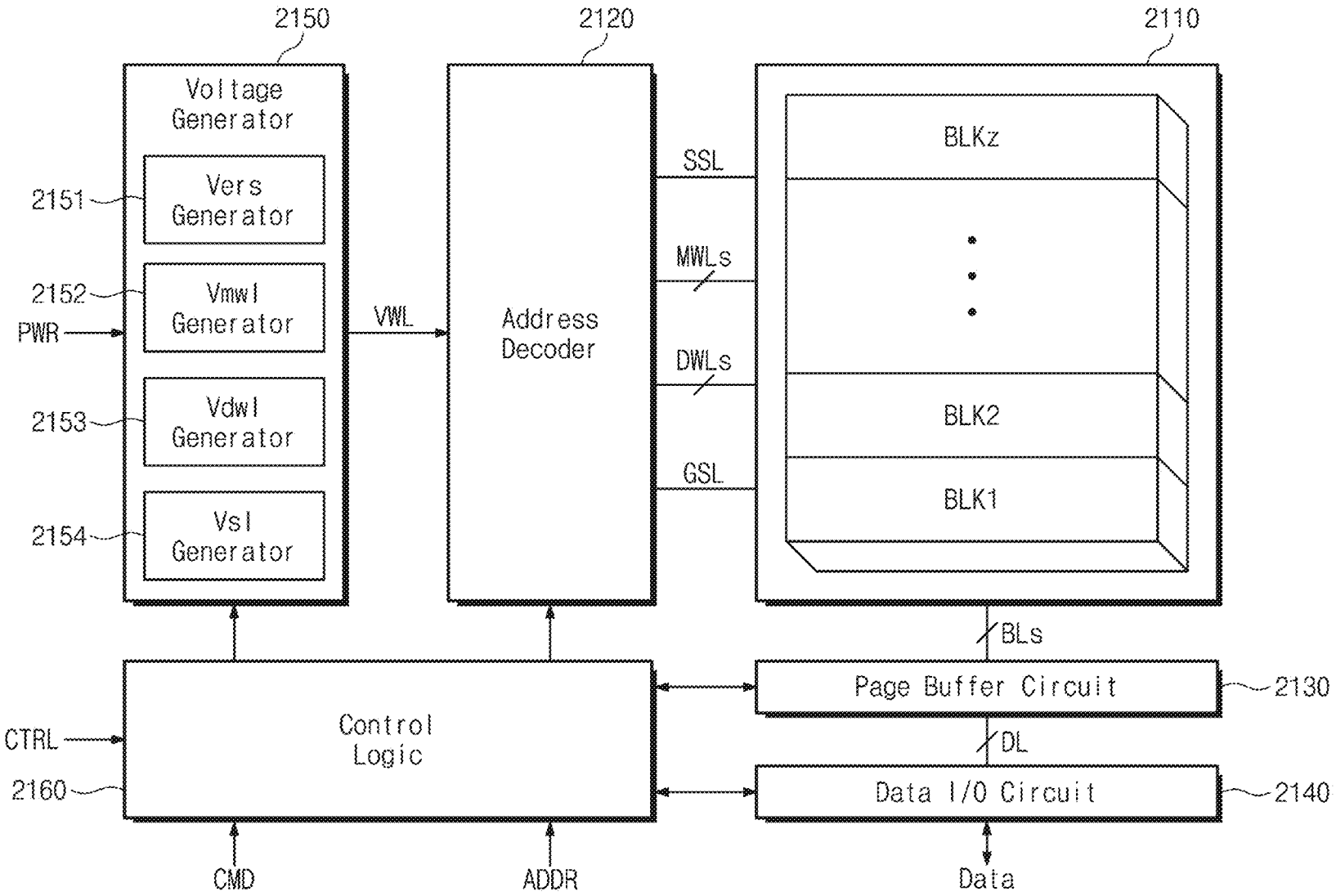
FIG. 14 is a block diagram illustrating another embodiment of the flash memory illustrated in FIG. 1.

FIG. 14 is a block diagram illustrating another embodiment of the flash memory illustrated in FIG. 1. Referring to FIG. 14, a flash memory 2100 includes a memory cell array 2110, an address decoder 2120, a page buffer circuit 2130, a data input/output circuit 2140, a voltage generator 2150 and control logic 2160.

The memory cell array 2110 includes a plurality of memory blocks BLK1~BLKz having a 3D structure. The address decoder 2120 is connected to the memory cell array 2110 through a string select line SSL, a ground select line GSL, main word lines MWLs and dummy word lines DWLs. The page buffer circuit 2130 is connected to the memory cell array 2110 through bit lines BLs. The data input/output circuit 2140 is connected to the page buffer circuit 2130 through a data line DL. The control logic 2160 can control program, read and erase operations of the flash memory 2100 using a command CMD, an address ADDR and a control signal CTRL.

The voltage generator 2150 can include Vers generator 2151, a Vmwl generator 2152, a Vdwl generator 2153 and a Vsl generator 2154. The Vers 2151 generates an erase voltage and provides the erase voltage to a channel through a substrate SUB when an erase operation is performed. The Vmwl 2152 generates a main word line voltage Vmwl being provided to the main word line MWL when an erase operation is performed. The Vdwl generator 2153 generates a dummy word line voltage Vdwl being provided to the dummy word line DWL when an erase operation is performed. The Vsl generator 2154 generates a select line voltage Vsl being provided to the string select line SSL or the ground select line GSL.

Figure 15:
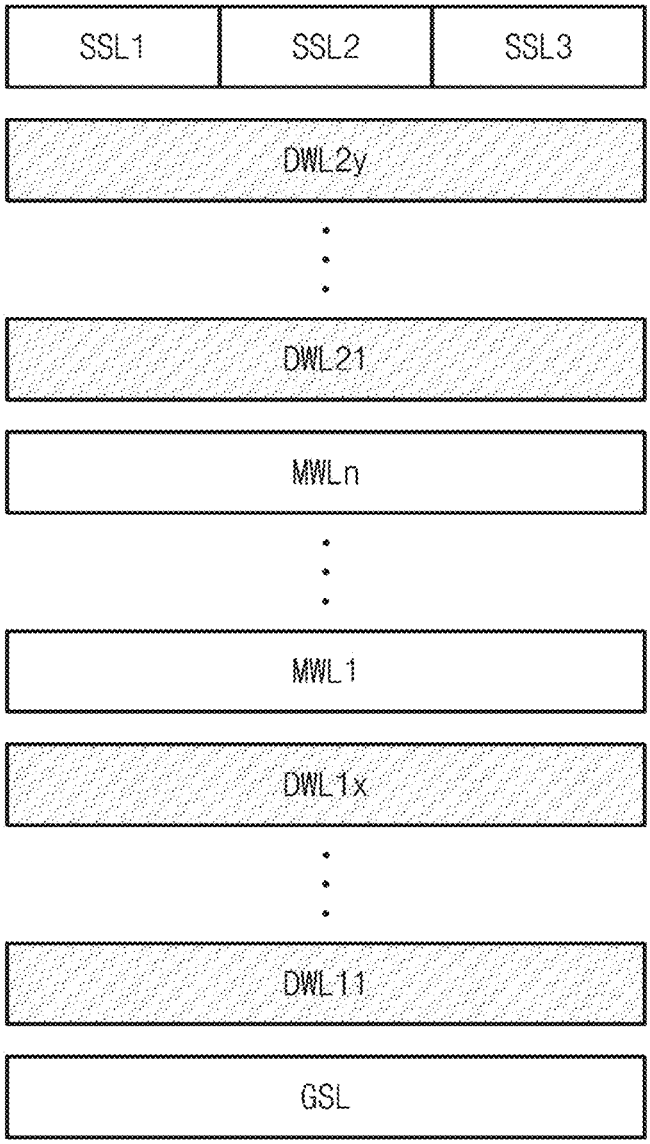
FIG. 15 is a schematic view illustrating a word line structure of the three-dimensional (3D) flash memory illustrated in FIG. 14.

FIG. 15 is a schematic view illustrating in one example a word line configuration for the 3D flash memory of FIG. 14. Referring to FIG. 15, a first dummy word line DWL1, inclusive of a first number of dummy word lines DWL11~DWL1x, is disposed between the ground select line GSL and a first main word line MWL1, and a second dummy word line DWL2, inclusive of a second number of dummy word lines DWL21~DWL2y, is disposed between string select lines SSL1~SSL3 and nth main word line MWLn, wherein the first number and the second number are different.

As illustrated in FIG. 15, the 3D flash memory 2100 may include multiple individual (or grouped) word lines in each of the first and second dummy word lines DWL1 and DWL2. In such cases, the 3D flash memory 2100 may increase an erase speed for main memory cells and alleviates stress of the dummy memory cell due to a repeated erase operation by controlling the dummy word line voltage Vdwl being provided to each dummy word line DWL when an erase operation is performed.

Figure 16:
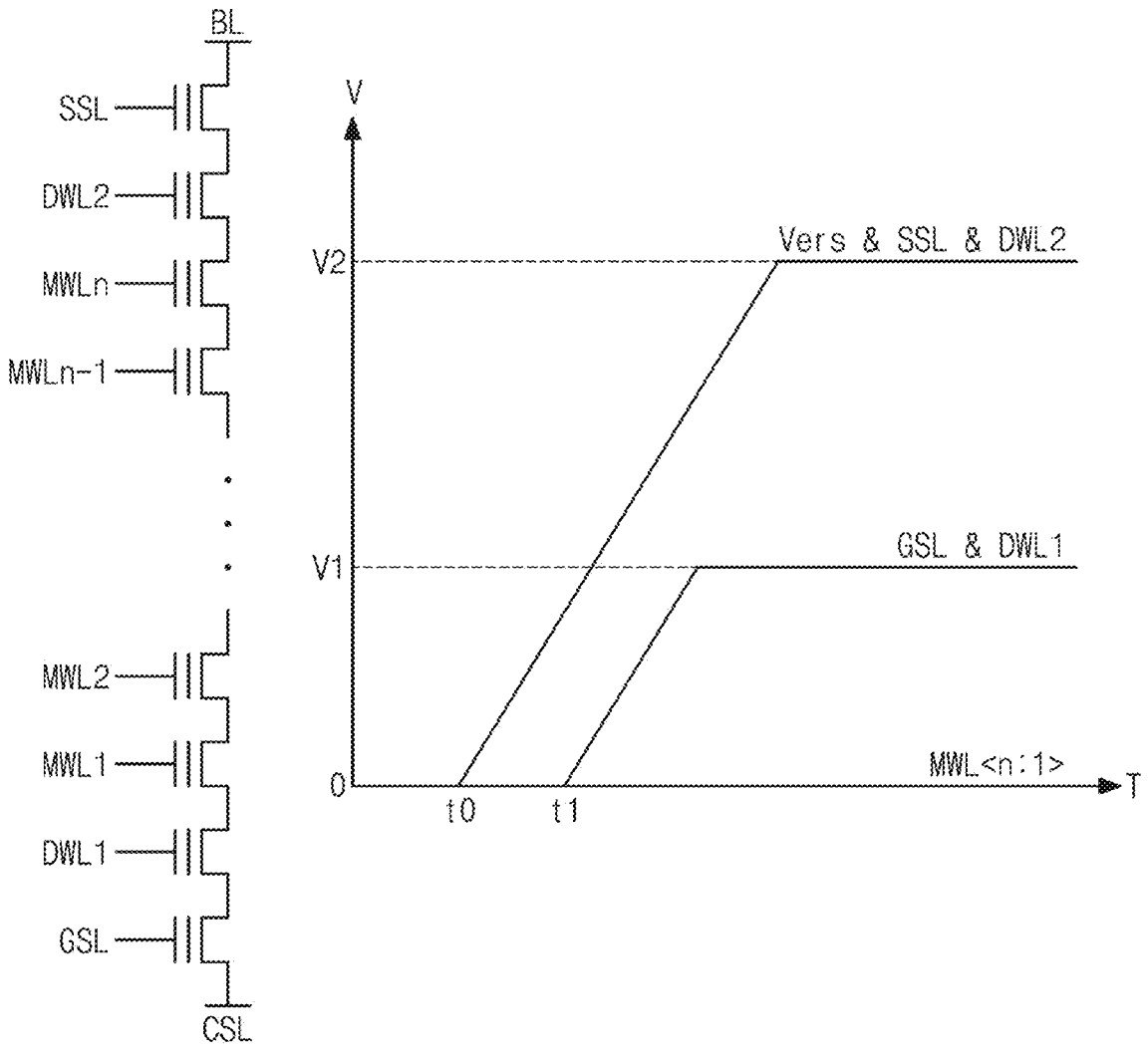
FIG. 16 is a graph illustrating an example of a voltage level of a dummy word line when an erase operation of a three-dimensional (3D) flash memory is performed.

FIG. 16 is a graph illustrating an example of a voltage level of a dummy word line during an erase operation performed by the 3D flash memory of FIG. 15. In FIG. 16, the vertical axis and the horizontal axis respectively show voltage V and time T. Referring to FIG. 16, the first dummy word line DWL1 is located between the ground select line GSL and the first main word line MWL1 and the second dummy word line DWL2 is located between the string select line SSL and the nth main word line MWLn.

Generally, a 3D flash memory has to be floated to erase a dummy memory cell together with a main memory cell or not to erase a dummy memory cell when an erase operation is performed. A 3D flash memory can make a dummy word line voltage become a floating level from 0V according to a specific erase voltage to induce an erase bias into a channel A 3D flash memory can apply a voltage to the dummy word line DWL at a distance of time T. An effect equivalent to applying a constant voltage can be obtained by controlling a floating time according to a delay time.

Referring to FIG. 16, a voltage of 0V is applied to the main word lines MWL1~MWLn (also indicated in the graph as MWL<n:1>) at t0 during an erase operation. A voltage V1 is applied to the ground select line GSL and the first dummy word line DWL1 at t1. The V1 is higher than 0V and lower than V2. An erase voltage Vers having V2 is applied to the substrate SUB, the string select line SSL and the second dummy word line DWL2.

Figure 17:
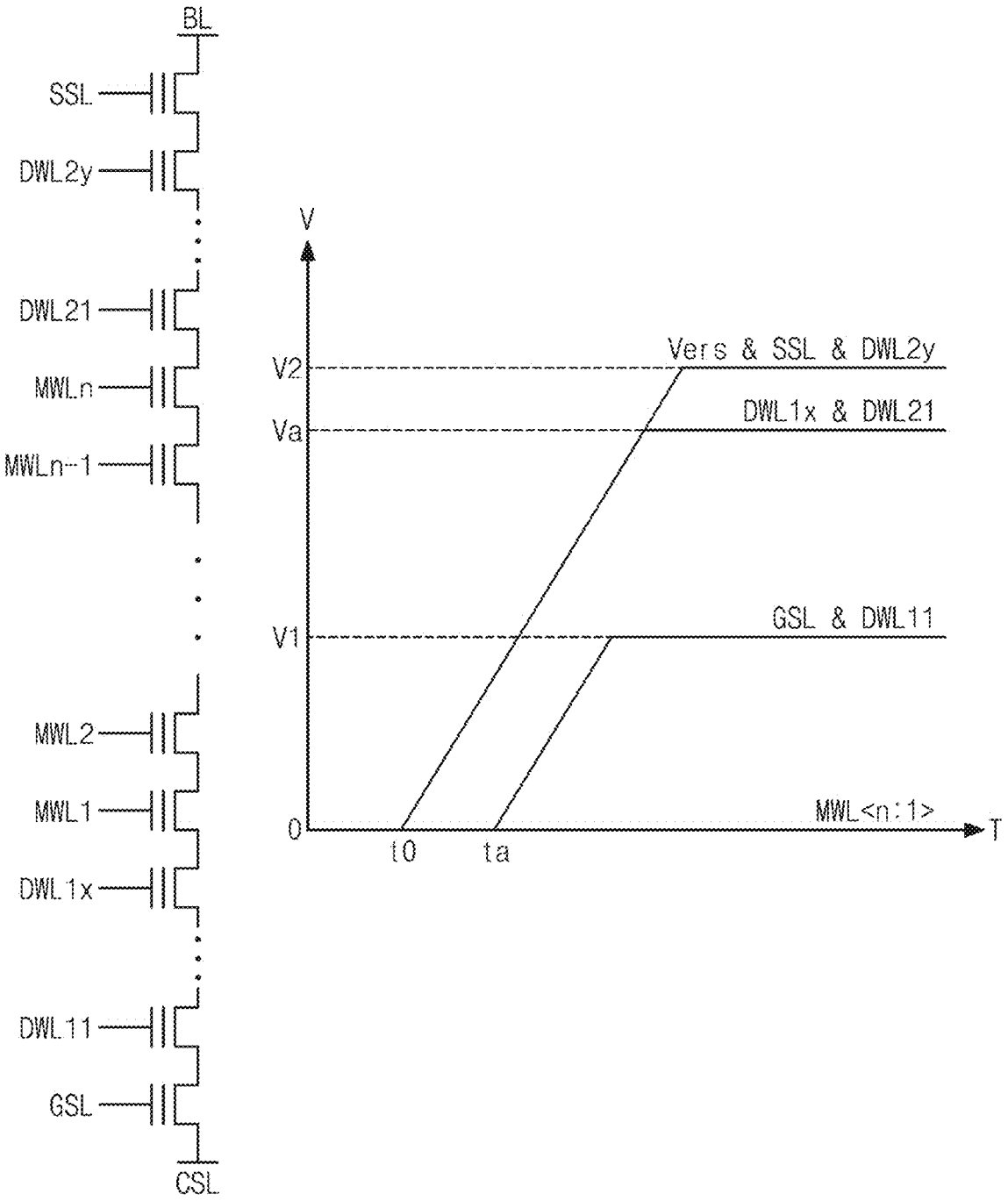
FIG. 17 is a graph illustrating an example of a voltage level of a dummy word line when an erase operation of the three-dimensional (3D) flash memory illustrated in FIG. 15 is performed.

FIG. 17 is a graph illustrating an example of a voltage level of a dummy word line at various times T during an erase operation performed by the 3D flash memory illustrated of FIG. 15. Referring to FIG. 17, x number of first dummy word lines DWL11~DWL1x are located between the ground select line GSL and the first main word line MWL1 and y number of second dummy word lines DWL21~DWL2y are located between the string select line SSL and the nth main word line MWLn.

Referring to FIG. 17, a voltage of 0V is applied to the main word lines MWL1~MWLn (also indicated in the graph as MWL<n:1>) at t0 during an erase operation. A delayed scheme of making a dummy word line voltage become a floating level V1 at ta from 0V is used in a dummy word line DWL11 adjacent to the ground select line GSL. The 3D flash memory easily provides the erase voltage Vers to a channel using the delayed scheme. The erase voltage Vers is provided to a dummy word line DWL2y adjacent to the string select line SSL.

A voltage Va having an offset value with respect to the erase voltage Vers is applied to inner dummy word lines DWL1x and DWL21 adjacent to the main word lines MWL1~MWLn. The 3D flash memory may increase erase speed in the adjacent main memory cell by providing a voltage Va using the delayed scheme. The Va is higher than the V1 and lower than the V2. Thus, the 3D flash memory can alleviate stress of the dummy memory cell due to repeated erase operations and guarantees a greater possible number of P/E cycles.

The data storage device in accordance with embodiments of the inventive concept may be applied to various types of products. The data storage device can be embodied by not only electronic devices such as a personal computer, a digital camera, a camcorder, a cellular phone, a MP3, a PMP, a PSP, a PDA, etc. but also storage devices such as a memory card, a USB memory, a solid state drive (SSD), etc.

Figure 18:
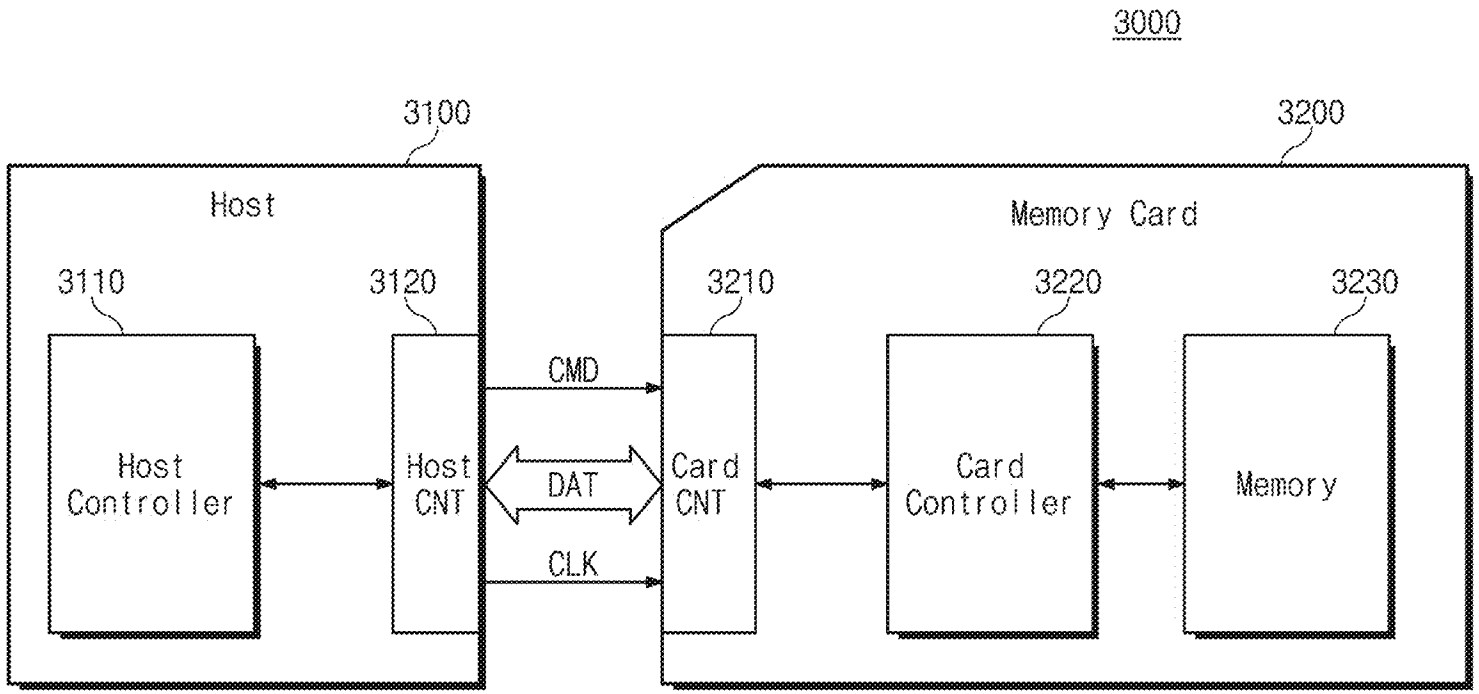
FIG. 18 is a block diagram illustrating an example of applying the data storage device in accordance with some exemplary embodiments of the inventive concept to a memory card.

FIG. 18 is a block diagram illustrating an example of applying the data storage device in accordance with some exemplary embodiments of the inventive concept to a memory card. A memory card system 3000 includes a host 3100 and a memory card 3200. The host 3100 includes a host controller 3110 and a host connection unit (Host CNT) 3120. The memory card 3200 includes a card connection unit (Card CNT) 3210, a card controller 3220 and a flash memory 3230. The flash memory 3230 is embodied by the 3D flash memory described above.

The host 3100 writes data in the memory card 3200 or reads data stored in the memory card 3200. The host controller 3110 transmits a command (e.g., a write command), a clock signal CLK generated from a clock generator in the host 3100 and data DAT to the memory card 3200 through the host connection unit 3120.

The card controller 3220 stores data in the flash memory 3230 in synchronization with a clock signal CLK generated from a clock generator in the card controller 3220 in response to a write command received through the card connection unit 3210. The flash memory 3230 stores data transmitted from the host 3100. In the case that the host 3100 is a digital camera, the flash memory stores image data.

Figure 19:
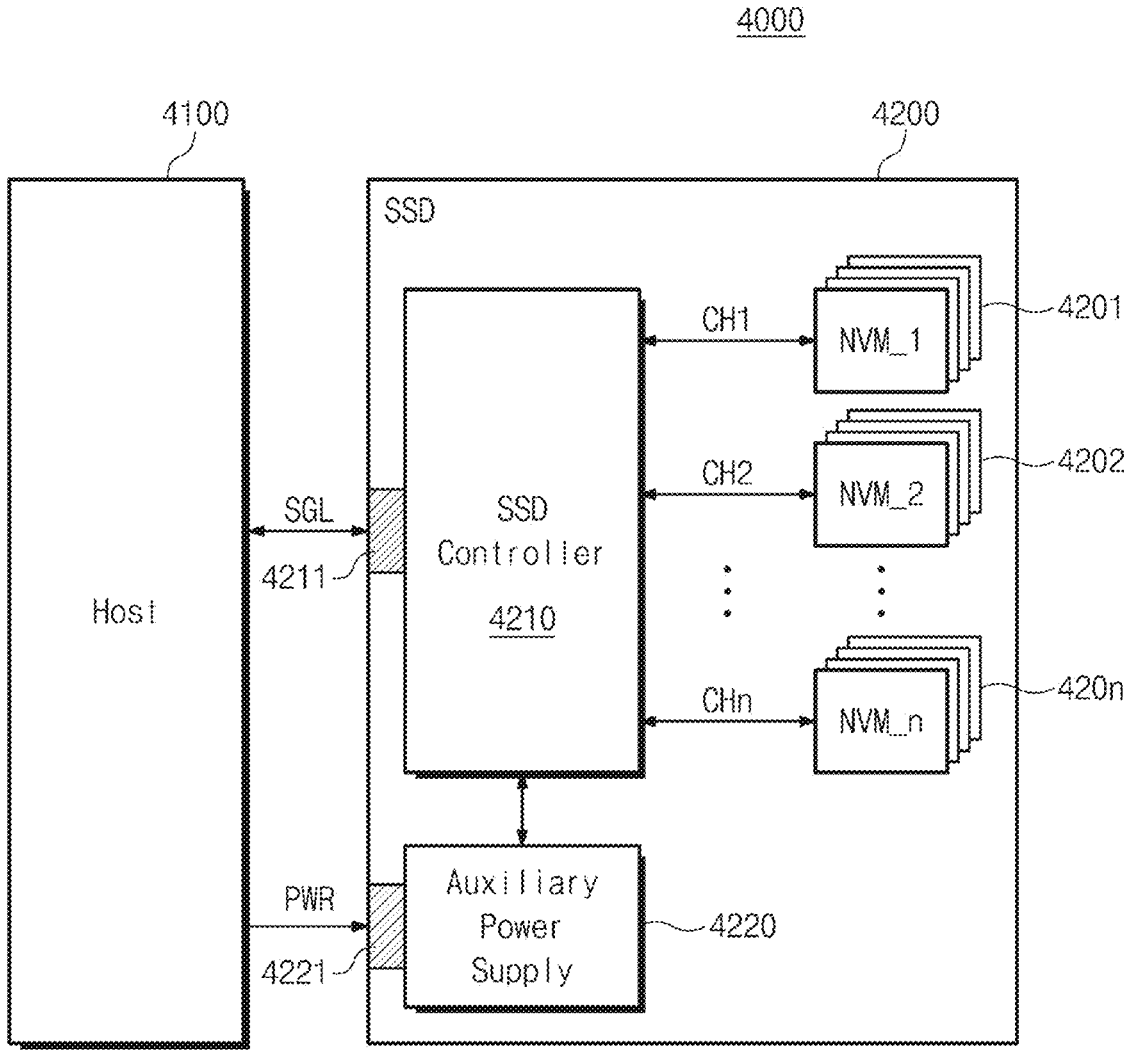
FIG. 19 is a block diagram illustrating an example of applying the data storage device in accordance with some exemplary embodiments of the inventive concept to a solid state drive (SSD).

FIG. 19 is a block diagram illustrating an example of applying the data storage device in accordance with some exemplary embodiments of the inventive concept to a solid state drive (SSD). Referring to FIG. 19, a SSD system 4000 includes a host 4100 and a SSD 4200.

The SSD 4200 exchanges a signal with the host 4100 through a signal connector 4211 and receives power through a power connector 4221. The SSD 4200 may include a plurality of flash memories 4201~420n (NVM_1~NVM_n), a SSD controller 4210 and an auxiliary power supply 4220.

The flash memories 4201~420n are used as a storage medium of the SSD 4200. A nonvolatile memory device such as PRAM, a MRAM, a ReRAM, a FRAM, etc. besides the flash memory can be used as a storage medium of the SSD 4200. The flash memories 4201~420n can be connected to the SSD controller 4210 through a plurality of channels CH1~CHn. One or more flash memories can be connected to each channel. Flash memories connected to each channel can be connected to a same data bus.

The SSD controller 4210 exchanges a signal SGL with the host 4100 through the signal connector 4211. The signal SGL includes a command, an address, data, etc. The SSD controller 4210 writes data in a corresponding flash memory or reads data from a corresponding flash memory according to a command of the host 4100.

The auxiliary power supply 4220 is connected to the host 4100 through the power connector 4221. The auxiliary power supply 4220 can receive power from the host 4100 to charge it. The auxiliary power supply 4220 can be located inside or outside the SSD 4200. For example, the auxiliary power supply 4220 is located on a main board and can provide auxiliary power to the SSD 4200.

Figure 20:
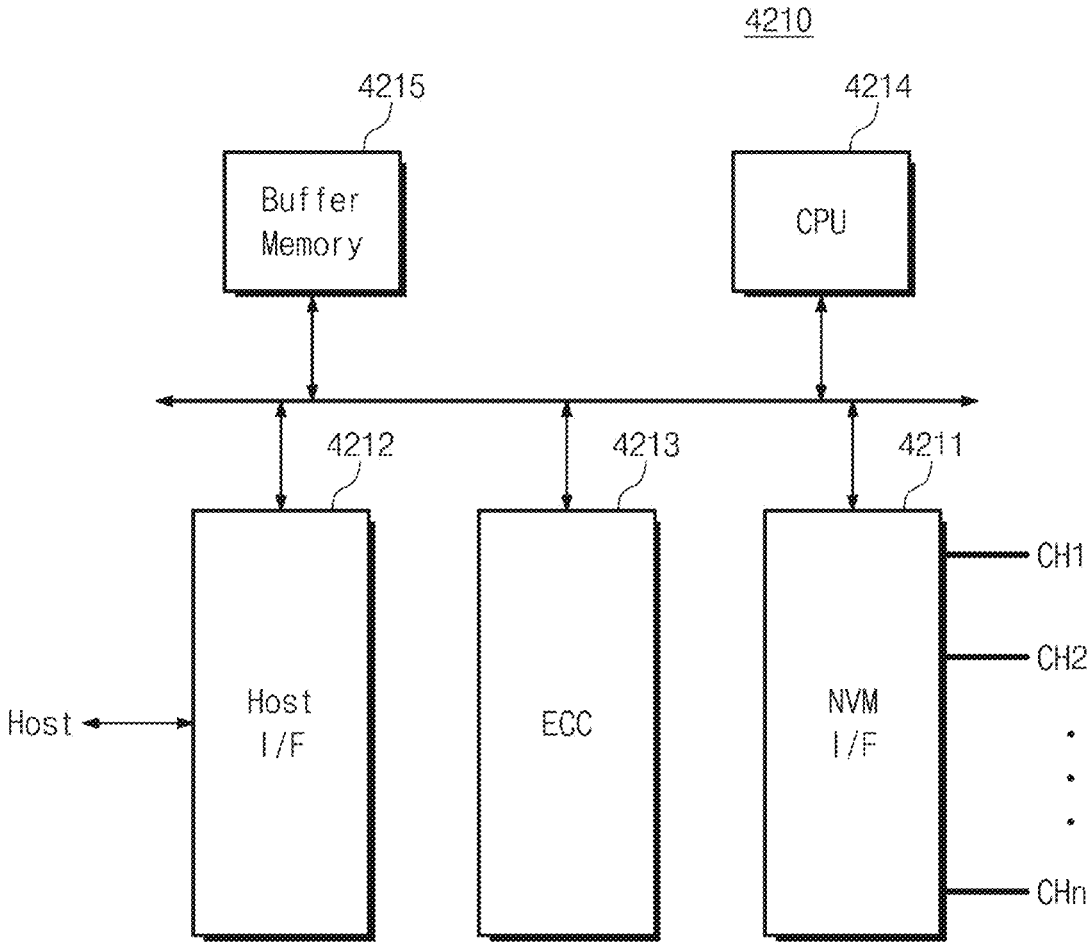
FIG. 20 is a block diagram illustrating a constitution of the SSD controller illustrated in FIG. 19 as an illustration.

FIG. 20 is a block diagram illustrating a constitution of the SSD controller 4210 illustrated in FIG. 19 as an illustration. Referring to FIG. 20, the SSD controller 4210 includes a NVM interface (IF) 4211, a host interface (IF) 4212, an ECC circuit 4213, a central processing unit (CPU) 4214 and a buffer memory 4215.

The NVM interface 4211 scatters data transmitted from the buffer memory 4215 to channels CH1~CHn. The NVM interface 4211 transmits data read from the flash memories 4201~420n to the buffer memory 4215. The NVM interface 4211 can use an interface method of the flash memory. That is, the SSD controller 4210 can perform a program, read or erase operation according to an interface method of the flash memory.

The host interface 4212 corresponds to a protocol of the host 4100 to provide an interfacing with the SSD 4200. The host interface 4212 can communicate with the host 4100 using a USB (universal serial bus), a SCSI (small computer small interface), a PCI express, an ATA, a PATA (parallel ATA), a SATA (serial ATA), a SAS (serial attached SCSI), etc. The host interface 4212 can perform a function of a disk emulation supporting so that the host 4100 recognizes the SSD 4200 as a hard disk drive (HDD).

The ECC circuit 4213 generates an error correction code ECC using data being transmitted to the flash memories 4201~420n. The generated error correction code ECC is stored in a spare area of the flash memories 4201~420n. The ECC circuit 4213 detects an error of data read from the flash memories 4201~420n. If the detected error is within a correction capacity, the ECC circuit 4213 corrects the detected error.

The central processing unit 4214 analyzes and processes a signal SGL received from the host 4100. The central processing unit 4214 controls the host 4100 or the flash memories 4201~420n through the host interface 4212 or the NVM interface 4211. The central processing unit 4214 controls the flash memories 4201~420n according to a firmware for driving the SSD 4200.

The buffer memory 4215 temporarily stores write data being provided from the host 4100 or data read from the flash memories 4201~420n. The buffer memory 4215 can store meta data or cache data to be stored in the flash memories 4201~420n. When a sudden power off operation is performed, meta data or cache data stored in the buffer memory 4215 is stored in the flash memories 4201~420n. The buffer memory 4215 may include a DRAM, a SRAM, etc.

Figure 21:
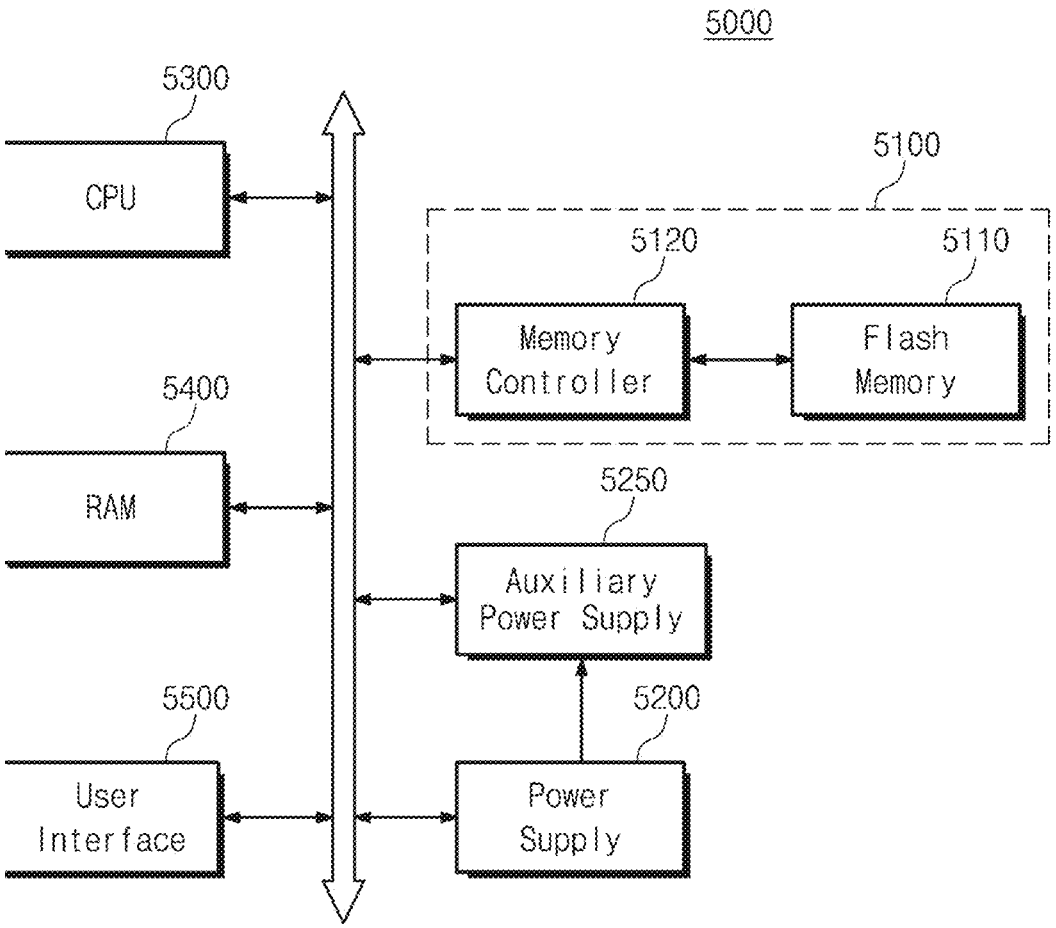
FIG. 21 is a block diagram illustrating an example that the data storage device in accordance with some exemplary embodiments of the inventive concept is embodied by an electronic device.

FIG. 21 is a block diagram illustrating an example that the data storage device in accordance with some exemplary embodiments of the inventive concept is embodied by an electronic device. An electronic device 5000 can be embodied by a personal computer (PC) or a portable electronic device such as a notebook computer, a cellular phone, a personal digital assistant (PDA) and a camera.

Referring to FIG. 21, the electronic device 5000 includes a memory system 5100, a power supply 5200, an auxiliary power supply 5250, a central processing unit (CPU) 5300, a RAM 5400 and a user interface 5500. The memory system 5100 includes a flash memory 5110 and a memory controller 5120.

A 3D flash memory device in accordance with some exemplary embodiments of the inventive concept has a structure such that dummy word lines located adjacent to a string select line and dummy word lines located adjacent to a ground select line are asymmetric. According to the inventive concept, when a program operation is performed, an electric field difference (Es−Eg) between an electric field Es between a boosted channel of a program inhibit cell and a bit line and an electric field Eg between the boosted channel and a common source line can be reduced and thereby program disturbance can be reduced.

As has been noted above, the terms "uppermost" and "lowermost" word lines among a plurality of word lines are arbitrary terms intended to define opposite ends (e.g., vertical ends) of a 3D memory cell array. However, these terms should not be read and interrupted in an overly literal manner, recognizing that "upper" and "lower" are relative terms drawn to an arbitrary assumption of "up" and "down". Further, recognizing that semiconductor memory devices may be fabricated in many different orientations relative to one or more substrates, those skilled in the art will understand the terms "uppermost" and "lowermost" as merely designating different word lines disposed as opposing sides of a memory cell array.

Having described certain embodiments of the inventive concept, it is further noted that it is readily apparent to those of reasonable skill in the art that various modifications may be made without departing from the scope of the inventive concept as defined by the appended claims.

What is claimed is:

[1. A three-dimensional (3D) flash memory device comprising:

a plurality of cell strings arranged, each of the plurality of cell strings including a string select transistor, first and second dummy transistors, a plurality of memory cells, third and fourth dummy transistors and a ground select transistor stacked in a direction perpendicular to a substrate;

a dummy word line voltage generator configured to provide a first voltage to a first dummy word line connected to the first dummy transistor, a second voltage to a second dummy word line connected to the second dummy transistor, a third voltage to a third dummy word line connected to the third dummy transistor, and a fourth voltage to a fourth dummy word line connected to the fourth dummy transistor during an erase operation; and a word line voltage generator configured to apply a fifth voltage to a plurality of main word lines connected to the plurality of memory cells respectively during the erase operation, wherein the second dummy transistor and the third dummy transistor are disposed between the first dummy transistor and the fourth dummy transistor, the second voltage and the third voltage are the same, and the second voltage is different from the first voltage and the fourth voltage.]

[2. The 3D flash memory device of claim 1, wherein the first dummy transistor is adjacent to the string select transistor, the plurality of memory cells is disposed between the second dummy transistor and the third dummy transistor, and the fourth dummy transistor is adjacent to the ground select transistor.]

[3. The 3D flash memory device of claim 1, further comprising:

an erase voltage generator configured to provide an erase voltage to the substrate during the erase operation.]

[4. The 3D flash memory device of claim 1, wherein the string select transistor, the first and second dummy transistors, the plurality of memory cells, the third and fourth dummy transistors and the ground select transistor of each of the cell strings share a channel perpendicular to the substrate.]

[5. The 3D flash memory device of claim 1, wherein memory cells having a same height from the substrate share a main word line among the plurality of main word lines.]

[6. The 3D flash memory device of claim 1, wherein the second voltage is lower than the first voltage.]

[7. The 3D flash memory device of claim 6, wherein the word line voltage generator is configured to apply a sixth voltage that is higher than the second voltage to a string select line connected to the string select transistor.]

[8. The 3D flash memory device of claim 1, wherein the fourth voltage is applied after the second voltage is applied.]

[9. The 3D flash memory device of claim 1, further comprising:

a fifth dummy transistor that is located between the first dummy transistor and the second dummy transistor.]

[10. A method of performing an erase operation of a three-dimensional (3D) flash memory device, the 3D flash memory device comprising a plurality of cell strings, each of the plurality of cell strings including a string select transistor, first and second dummy transistors, a plurality of memory cells, third and fourth dummy transistors and a ground select transistor stacked in a direction perpendicular to a substrate, the second dummy transistor and the third dummy transistor disposed between the first dummy transistor and the fourth dummy transistor, the method comprising:

applying an erase voltage to the substrate;

applying a first voltage to a first dummy word line connected to the first dummy transistor;

applying a second voltage to a second dummy word line connected to the second dummy transistor;

applying a third voltage to a third dummy word line connected to the third dummy transistor;

applying a fourth voltage to a fourth dummy word line connected to the fourth dummy transistor; and applying a fifth voltage to a plurality of main word lines connected to the plurality of memory cells, wherein the second voltage and the third voltage are the same, and the second voltage is different from the first voltage and the fourth voltage.]

[11. The method of claim 10, wherein the first dummy transistor is adjacent to the string select transistor, the plurality of memory cells is disposed between the second dummy transistor and the third dummy transistor, and the fourth dummy transistor is adjacent to the ground select transistor.]

[12. The method of claim 11, wherein the second voltage is lower than the first voltage.]

[13. The method of claim 12, further comprising:

applying a sixth voltage that is higher than the second voltage to a string select line connected to the string select transistor.]

[14. The method of claim 13, further comprising:

applying a seventh voltage to a fifth dummy word line connected to a fifth dummy transistor, wherein the fifth dummy transistor is located between the first dummy transistor and the second dummy transistor.]

[15. The method of claim 14, wherein the fourth voltage is applied after the second voltage is applied.]

[16. A data storage device comprising:

a three-dimensional (3D) flash memory device comprising a plurality of memory blocks, each of the plurality of memory blocks including a plurality of cell strings, each of the plurality of cell strings including a string select transistor, first and second dummy transistors, a plurality of memory cells, third and fourth dummy transistors and a ground select transistor stacked in a direction perpendicular to a substrate; and a controller configured to transmit an erase command and an address indicating a selected memory block among the plurality of memory blocks to the 3D flash memory device, wherein the 3D flash memory device further comprises:

a dummy word line voltage generator configured to provide a first voltage to a first dummy word line connected to the first dummy transistor, a second voltage to a second dummy word line connected to the second dummy transistor, a third voltage to a third dummy word line connected to the third dummy transistor, and a fourth voltage to a fourth dummy word line connected to the fourth dummy transistor during an erase operation; and a word line voltage generator configured to apply a fifth voltage to a plurality of main word lines connected to the plurality of memory cells respectively during the erase operation, wherein the second dummy transistor and the third dummy transistor are disposed between the first dummy transistor and the fourth dummy transistor, the second voltage and the third voltage are the same, and the second voltage is different from the first voltage and the fourth voltage.]

[17. The data storage device of claim 16, wherein string select transistors in cell strings among the plurality of cell strings arranged in different rows are connected to different string select lines in each of the plurality of memory blocks, and string select transistors in cell strings among the plurality of cell strings arranged in a same row are connected to a same string select line in each of the plurality of memory blocks.]

[18. The data storage device of claim 16, wherein string select transistors in cell strings among the plurality of cell strings arranged in different columns are connected to different bit lines in each of the plurality of memory blocks, and string select transistors in cell strings among the plurality of cell strings arranged in a same column are connected to a same bit line in each of the plurality of memory blocks.]

[19. The data storage device of claim 16, wherein the first dummy transistor is adjacent to the string select transistor, the plurality of memory cells is disposed between the second dummy transistor and the third dummy transistor, and the fourth dummy transistor is adjacent to the ground select transistor, wherein the second voltage is lower than the first voltage.]

[20. The data storage device of claim 16, wherein the word line voltage generator is configured to apply a sixth voltage that is higher than the second voltage to a string select line connected to the string select transistor.]

*21. A three-dimensional (3D) flash memory device comprising:*

*a plurality of cell strings, a cell string of the plurality of cell strings being connected between a common source line and a bit line and including a ground select transistor, at least one first dummy memory cell, a plurality of memory cells, at least one second dummy memory cell and a string select transistor being sequentially stacked along a direction perpendicular to a substrate;*

*wherein the ground select transistor is connected to a ground select line, the at least one first dummy memory cell is connected to at least one first dummy word line, the plurality of memory cells are connected to a plurality of word lines respectively, the at least one second dummy memory cell is connected to at least one second dummy word line respectively, the string select transistor is connected to a string select line,*

*wherein the ground select transistor is adjacent to the substrate and the string select transistor is adjacent to the bit line,*

*wherein the at least one first dummy word line is disposed between the ground select line and the plurality of word lines and adjacent to a lowermost word line of the plurality of word lines, the at least one second dummy word line is disposed between the string select line and the plurality of word lines and adjacent to an uppermost word line of the plurality of word lines,*

*wherein a first separation length between the ground select line and the at least one first dummy word line is different from a second separation length between the string select line and the at least one second dummy word line, and*

*wherein a third separation length between the ground select line and the lowermost word line is different from a fourth separation length between the string select line and the uppermost word line,*

*a dummy word line voltage generator configured to provide at least one first voltage to the at least one first dummy word line and provide at least one second*

*voltage to the at least one second dummy word line during an erase operation; and*

*a select line voltage generator configured to generate a string select line voltage applied to the string select line and a ground select line voltage applied to the ground select line during the erase operation.*

*22. The 3D flash memory device of claim 21, wherein the at least one first voltage is different from the ground select line voltage.*

*23. The 3D flash memory device of claim 21, wherein the at least one second voltage is different from the string select line voltage.*

*24. The 3D flash memory device of claim 21, wherein the at least one first voltage is different from the at least one second voltage.*

*25. The 3D flash memory device of claim 21, further comprising:*

*an erase voltage generator configured to generate an erase voltage applied to the substrate during the erase operation;*

*a word line voltage generator configured to apply third voltages to the plurality of word lines during the erase operation.*

*26. The 3D flash memory device of claim 25, further comprising:*

*control logic circuitry configured to receive a command and an address via an arrangement of input and output lines and receive a control signal via designated control lines from an external device;*

*a data input and output circuit configured to receive or output data via the arrangement of input and output lines from or to the external device;*

*a page buffer circuit connected to the plurality of cell strings via a plurality of bit lines and configured to receive or output the data from or to the data input and output circuit, and temporarily store the data to be programmed to or the data read from selected memory cells of the plurality of cell strings during a program or read operation; and*

*an address decoder connected to the plurality of word lines, the at least one first dummy word line and the at least one second dummy word line, configured to receive the at least one first voltage and the at least one second voltage from the dummy word line voltage generator and the third voltages from the word line voltage generator, and configured to apply the at least one first voltage to the at least one first dummy word line, apply the at least one second voltage to the at least one second dummy word line, and apply the third voltages to the plurality of word lines during the erase operation under a control of the control logic circuitry,*

*wherein the dummy word line voltage generator is configured to receive a power supply voltage via power supply lines from the external device and generate the at least one first voltage and the at least one second voltage from the power supply voltage,*

*wherein the word line voltage generator is configured to receive the power supply voltage via the power supply lines from the external device and generate the third voltages from the power supply voltage.*

*27. A three-dimensional (3D) flash memory device comprising:*

*a plurality of cell strings, a cell string of the plurality of cell strings being connected between a common source line and a bit line and including a ground select transistor, at least one first dummy memory cell, a plurality of memory cells, at least one second dummy memory cell and a string select transistor being sequentially stacked along a direction perpendicular to a substrate;*

*wherein the ground select transistor is connected to a ground select line, the at least one first dummy memory cell is connected to at least one first dummy word line, the plurality of memory cells are connected to a plurality of word lines respectively, the at least one second dummy memory cell is connected to at least one second dummy word line respectively, the string select transistor is connected to a string select line,*

*wherein the ground select transistor is adjacent to the substrate and the string select transistor is adjacent to the bit line,*

*wherein the at least one first dummy word line is disposed between the ground select line and the plurality of word lines and adjacent to a lowermost word line of the plurality of word lines, the at least one second dummy word line is disposed between the string select line and the plurality of word lines and adjacent to an uppermost word line of the plurality of word lines,*

*wherein a first separation length between the ground select line and the at least one first dummy word line is different from a second separation length between the string select line and the at least one second dummy word line, and*

*wherein a third separation length between the ground select line and the lowermost word line is different from a fourth separation length between the string select line and the uppermost word line,*

*a dummy word line voltage generator configured to provide at least one first voltage to the at least one first dummy word line and provide at least one second voltage to the at least one second dummy word line during a program operation; and*

*a select line voltage generator configured to generate a string select line voltage applied to the string select line and a ground select line voltage applied to the ground select line during the program operation.*

*28. The 3D flash memory device of claim 27, wherein the at least one first voltage is different from the ground select line voltage.*

*29. The 3D flash memory device of claim 27, wherein the at least one second voltage is different from the string select line voltage.*

*30. The 3D flash memory device of claim 27, wherein the at least one first voltage is different from the at least one second voltage.*

*31. The 3D flash memory device of claim 27, further comprising:*

*an erase voltage generator configured to generate an erase voltage applied to the substrate during an erase operation;*

*a word line voltage generator configured to apply third voltages to the plurality of word lines during the erase operation;*

*a program voltage generator configured to generate a program voltage applied to a select word line among the plurality of word lines during the program operation; and*

*a pass voltage generator configured to generate pass voltages applied to the plurality of word lines during the program operation.*

*32. The 3D flash memory device of claim 31, further comprising:*

*control logic circuitry configured to receive a command and an address via an arrangement of input and output*

*lines and receive a control signal via designated control lines from an external device;*

*a data input and output circuit configured to receive or output data via the arrangement of input and output lines from or to the external device;*

*a page buffer circuit connected to the plurality of cell strings via a plurality of bit lines and configured to receive or output the data from or to the data input and output circuit, and temporarily store the data to be programmed to or the data read from selected memory cells of the plurality of cell strings during the program operation or a read operation; and*

*an address decoder connected to the plurality of word lines, the at least one first dummy word line and the at least one second dummy word line, configured to receive the at least one first voltage and the at least one second voltage from the dummy word line voltage generator and the third voltages from the word line voltage generator, and configured to apply the at least one first voltage to the at least one first dummy word line, apply the at least one second voltage to the at least one second dummy word line, and apply the third voltages to the plurality of word lines during the erase operation under a control of the control logic circuitry,*

*wherein the dummy word line voltage generator is configured to receive a power supply voltage via power supply lines from the external device and generate the at least one first voltage and the at least one second voltage from the power supply voltage,*

*wherein the word line voltage generator is configured to receive the power supply voltage via the power supply lines from the external device and generate the third voltages from the power supply voltage.*

*33. A three-dimensional (3D) flash memory device comprising:*

*a plurality of cell strings, a cell string of the plurality of cell strings being connected between a common source line and a bit line and including a ground select transistor, at least one first dummy memory cell, a plurality of memory cells, at least one second dummy memory cell and a string select transistor being sequentially stacked along a direction perpendicular to a substrate;*

*wherein the ground select transistor is connected to a ground select line, the at least one first dummy memory cell is connected to at least one first dummy word line, the plurality of memory cells are connected to a plurality of word lines respectively, the at least one second dummy memory cell is connected to at least one second dummy word line respectively, the string select transistor is connected to a string select line,*

*wherein the ground select transistor is adjacent to the substrate and the string select transistor is adjacent to the bit line,*

*wherein the at least one first dummy word line is disposed between the ground select line and the plurality of word lines and adjacent to a lowermost word line of the plurality of word lines, the at least one second dummy word line is disposed between the string select line and the plurality of word lines and adjacent to an uppermost word line of the plurality of word lines,*

*wherein a first separation length between the ground select line and the at least one first dummy word line is different from a second separation length between the string select line and the at least one second dummy word line, and*

*wherein a third separation length between the ground select line and the lowermost word line is different from a fourth separation length between the string select line and the uppermost word line,*

*a dummy word line voltage generator configured to provide at least one first voltage to the at least one first dummy word line and provide at least one second voltage to the at least one second dummy word line during a read operation; and*

*a select line voltage generator configured to generate a string select line voltage applied to the string select line and a ground select line voltage applied to the ground select line during the read operation.*

*34. The 3D flash memory device of claim 33, wherein the at least one first voltage is different from the ground select line voltage.*

*35. The 3D flash memory device of claim 33, wherein the at least one second voltage is different from the string select line voltage.*

*36. The 3D flash memory device of claim 33, wherein the at least one first voltage is different from the at least one second voltage.*

*37. The 3D flash memory device of claim 33, further comprising:*

*an erase voltage generator configured to generate an erase voltage applied to the substrate during an erase operation;*

*a word line voltage generator configured to apply third voltages to the plurality of word lines during the erase operation;*

*a program voltage generator configured to generate a program voltage applied to a select word line among the plurality of word lines during a program operation; and*

*a pass voltage generator configured to generate pass voltages applied to the plurality of word lines during the program operation.*

*38. The 3D flash memory device of claim 37, further comprising:*

*control logic circuitry configured to receive a command and an address via an arrangement of input and output lines and receive a control signal via designated control lines from an external device;*

*a data input and output circuit configured to receive or output data via the arrangement of input and output lines from or to the external device;*

*a page buffer circuit connected to the plurality of cell strings via a plurality of bit lines and configured to receive or output the data from or to the data input and output circuit, and temporarily store the data to be programmed to or the data read from selected memory cells of the plurality of cell strings during the program operation or the read operation; and*

*an address decoder connected to the plurality of word lines, the at least one first dummy word line and the at least one second dummy word line, configured to receive the at least one first voltage and the at least one second voltage from the dummy word line voltage generator and the third voltages from the word line voltage generator, and configured to apply the at least one first voltage to the at least one first dummy word line, apply the at least one second voltage to the at least one second dummy word line, and apply the third voltages to the plurality of word lines during the erase operation under a control of the control logic circuitry,*

*wherein the dummy word line voltage generator is configured to receive a power supply voltage via power*

*supply lines from the external device and generate the at least one first voltage and the at least one second voltage from the power supply voltage,*

*wherein the word line voltage generator is configured to receive the power supply voltage via the power supply lines from the external device and generate the third voltages from the power supply voltage.*

* * * * *